(12) United States Patent
Yamahira et al.

(10) Patent No.: US 10,848,078 B2
(45) Date of Patent: Nov. 24, 2020

(54) POWER CONVERTER WITH SWITCHING ELEMENTS, CONTROL CIRCUIT HAVING SPEED ADJUSTMENT RESISTOR, AND FEEDBACK ROUTE

(71) Applicant: DENSO CORPORATION, Kariya (JP)

(72) Inventors: Yuu Yamahira, Kariya (JP); Tetsuya Matsuoka, Kariya (JP); Kazuma Fukushima, Kariya (JP); Akifumi Araragi, Kariya (JP); Noriyuki Kakimoto, Kariya (JP); Masakiyo Sumitomo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/526,762

(22) Filed: Jul. 30, 2019

(65) Prior Publication Data
US 2020/0036297 A1 Jan. 30, 2020

(30) Foreign Application Priority Data

Jul. 30, 2018 (JP) .................................. 2018-142730

(51) Int. Cl.
*H02M 1/088* (2006.01)
*H02M 7/537* (2006.01)

(52) U.S. Cl.
CPC ........... *H02M 7/537* (2013.01); *H02M 1/088* (2013.01)

(58) Field of Classification Search
CPC ........ H02M 7/537; H02M 1/08; H02M 1/084; H02M 1/088; H02M 3/158
See application file for complete search history.

(56) References Cited

U.S. PATENT DOCUMENTS

| | | | | |
|---|---|---|---|---|
| 2009/0179606 | A1* | 7/2009 | Klemm | .................... H02M 1/08 318/509 |
| 2016/0218621 | A1* | 7/2016 | Hayashi | ................. H02M 1/088 |
| 2018/0102649 | A1* | 4/2018 | Dewa | ..................... H02M 1/088 |
| 2019/0310290 | A1* | 10/2019 | Araragi | .................. H02M 1/088 |
| 2019/0310675 | A1* | 10/2019 | Araragi | .................... H02M 1/08 |

FOREIGN PATENT DOCUMENTS

WO  2015/111215 A1  7/2015

* cited by examiner

*Primary Examiner* — Kyle J Moody
*Assistant Examiner* — Jye-June Lee
(74) *Attorney, Agent, or Firm* — Oliff PLC

(57) ABSTRACT

In a power converter, a control circuit has a speed adjustment resistor that limits a control current to adjust a switching speed of each of first and second switching elements. The speed adjustment resistor has a resistance that varies depending on a voltage at the control electrode of each of the first and second switching elements. A feedback route connects between the control electrode of the first switching element and the control electrode of the second switching element. The feedback route has a resistance that is set to be lower than a value of the resistance of the speed adjustment resistor during a predetermined Miller period of each of the first and second switching elements.

13 Claims, 25 Drawing Sheets

POWER CONVERTER WITH SWITCHING ELEMENTS, CONTROL CIRCUIT HAVING SPEED ADJUSTMENT RESISTOR, AND FEEDBACK ROUTE

CROSS REFERENCE TO RELATED APPLICATION

This application is based on and claims the benefit of priority from Japanese Patent Application No. 2018-142730 filed on Jul. 30, 2018, the disclosure of which is incorporated in its entirety herein by reference.

TECHNICAL FIELD

The present disclosure relates to power converters each comprised of at least two switching elements connected in parallel to each other, and a control circuit for on-off switching control of each of the switching elements.

BACKGROUND

One type of power converters for power conversion between direct-current (DC) power and alternating-current (AC) power includes switching elements, such as IGBTs, and a control circuit connected to the switching elements. Such a power converter is configured such that the control circuit controls on-off switching operations of each of the switching elements to thereby convert DC power supplied form a DC power source to AC power.

SUMMARY

According to an exemplary aspect of the present disclosure, there is provided a power converter. The power converter includes a first switching element, a second switching element connected in parallel to the first switching unit, and a control circuit configured to perform on-off switching operations of each of the first and second switching elements to thereby convert input power to output power.

Each of the first and second switching elements has a control electrode connected to the control circuit, and a reference electrode serving as a reference potential for a potential of the control electrode.

The control circuit has a speed adjustment resistor configured to limit a control current to adjust a switching speed of each of the first and second switching elements. The speed adjustment resistor has a resistance that varies depending on a voltage at the control electrode of each of the first and second switching elements. The power converter further includes a feedback route connecting between the control electrode of the first switching element and the control electrode of the second switching element. The feedback route has a resistance that is set to be lower than a value of the resistance of the speed adjustment resistor during a predetermined Miller period of each of the first and second switching elements.

BRIEF DESCRIPTION OF THE DRAWINGS

Other aspects of the present disclosure will become apparent from the following description of embodiments with reference to the accompanying drawings in which:

FIG. 1 is a circuit diagram schematically illustrating selected components of a power converter according to the first embodiment of the present disclosure immediately after first and second switching elements are turned on;

FIG. 18 is a circuit diagram schematically illustrating selected components of a power converter according to the eighth embodiment of the present disclosure when both first and second switching elements are turned on;

FIG. 19 is a circuit diagram schematically illustrating selected components of a power converter according to the eighth embodiment of the present disclosure when one of the first and second switching elements is turned on;

FIG. 25 is a circuit diagram schematically illustrating selected components of a power converter according to a comparative example of the first embodiment immediately after first and second switching elements are turned on.

DETAILED DESCRIPTION OF EMBODIMENT

VIEW POINT

Figure 1:
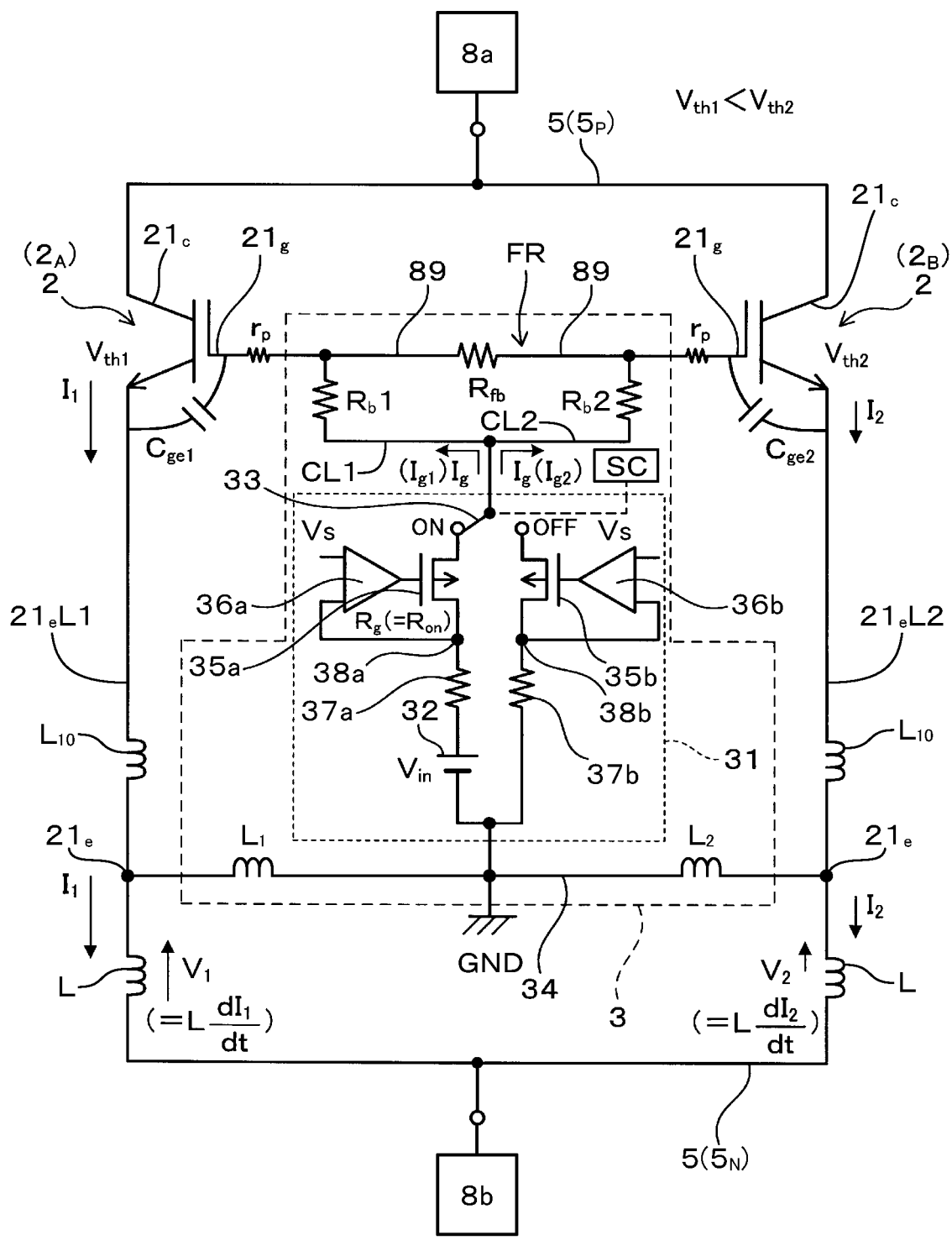

One type of power converters for power conversion between direct-current (DC) power and alternating-current (AC) power includes switching elements, such as IGBTs, and a control circuit connected to the switching elements. Such a power converter is configured such that the control circuit controls on-off switching operations of each of the switching elements to thereby convert DC power supplied form a DC power source to AC power.

In recent years, we have strongly demanded the development of power converters capable of outputting a larger current. For satisfying such a demand, we have been considering a power converter comprised of a plurality of switching elements connected in parallel to each other, and configured to perform on-off switching operations of the parallelly connected switching elements for turning on or off the parallelly connected switching elements substantially simultaneously. This enables a larger current to output from the set of the parallelly connected switching elements even if a relatively small current is supplied to flow through each of the parallelly connected switching elements.

An international patent application publication WO 2015/111215, which will be referred to as a published patent document, discloses such a power converter comprised of parallelly connected switching elements. In particular, the power converter disclosed in the published patent document is configured such that the control terminals of each adjacent pair of the parallelly connected switching elements are connected to one another via a capacitor. Note that the control terminal of a switching element, such as the gate of an IGBT, will also be collectively referred to as a gate hereinafter. The capacitor enables a current, i.e. a gate drive current, to be supplied equally to both the gates of the parallelly connected switching elements, enabling a gate voltage to be applied equally to each of the gates.

The power converter disclosed in the published patent document is also configured such that a relatively high resistor is connected in parallel to the capacitor through which the gates of each adjacent pair of the parallelly connected switching elements are connected to one another. The resistor connected in parallel to the capacitor through which the gates of each adjacent pair of the parallelly connected switching elements are connected to one another serves as a damping resistor for dampening noise. This enables the power converter to operate stably.

Such a power converter comprised of switching elements connected in parallel to one another may result in current values, which flow through the respective switching elements, being likely to be different from one another due to, for example, individually different characteristics of the switching elements from one another.

For example, switching elements have individually different gate threshold voltages from one another. A switching element, which has a lower threshold voltage, has a shorter charging time required for the gate voltage to have reached its gate threshold voltage, so that the switching element can be turned on faster. In contrast, a switching element, which has a higher threshold voltage, has a longer charging time required for the gate voltage to have reached its gate threshold voltage, so that the switching element can be turned on slower.

The difference in gate voltage among the switching elements connected in parallel to one another may cause current values flowing through the respective switching elements to be unbalanced from each other when any of the parallelly connected switching elements is turned on.

That is, supplying a gate current to commonly flow to the gate of each the respective switching elements connected in parallel to each other may result in current values flowing respectively through the parallelly connected switching elements being likely to be different from each other. This issue may be carried out when any of the parallelly connected switching elements is turned off.

From this viewpoint, one aspect of the present disclosure seeks to provide power converters each comprised of at least first and second switching elements connected in parallel to each other, each of which is enables current values flowing through the respective at least first and second switching elements to substantially balance with each other.

According to an exemplary aspect of the present disclosure, there is provided a power converter. The power converter includes a first switching element, a second switching element connected in parallel to the first switching unit, and a control circuit configured to perform on-off switching operations of each of the first and second switching elements to thereby convert input power to output power.

Each of the first and second switching elements has a control electrode connected to the control circuit, and a reference electrode serving as a reference potential for a potential of the control electrode.

The control circuit includes at least one drive unit configured to apply a control current to the control terminal of each of the first and second switching elements based on a control voltage to thereby turn on the corresponding one of the first and second switching elements, so that an on current flows through the reference electrode of the corresponding one of the first and second switching elements.

The control circuit has a speed adjustment resistor configured to limit the control current to adjust a switching speed of each of the first and second switching elements. The speed adjustment resistor has a resistance that varies depending on a voltage at the control electrode of each of the first and second switching elements. The power converter further includes a feedback route connecting between the control electrode of the first switching element and the control electrode of the second switching element. The feedback route has a resistance that is set to be lower than a value of the resistance of the speed adjustment resistor during a predetermined Miller period of each of the first and second switching elements.

This configuration enables a feedback current to be likely to flow through the feedback route, resulting in currents, which flow through the respective first and second switching elements, balancing with each other. This makes it possible to substantially uniform the amount of heat generated by each of the first and second switching elements with the amount of heat generated by the other of the first and second switching elements.

EMBODIMENT

The following describes embodiments of the present disclosure with reference to the accompanying drawings. In the embodiments, like parts between the embodiments, to which like reference characters are assigned, are omitted or simplified to avoid redundant description.

First Embodiment

The following describes the first embodiment of the present disclosure with reference to FIGS. 1 to 9. Each of FIGS. 1 to 4 illustrates selected components of a power converter 1 according to the first embodiment.

Figure 6:
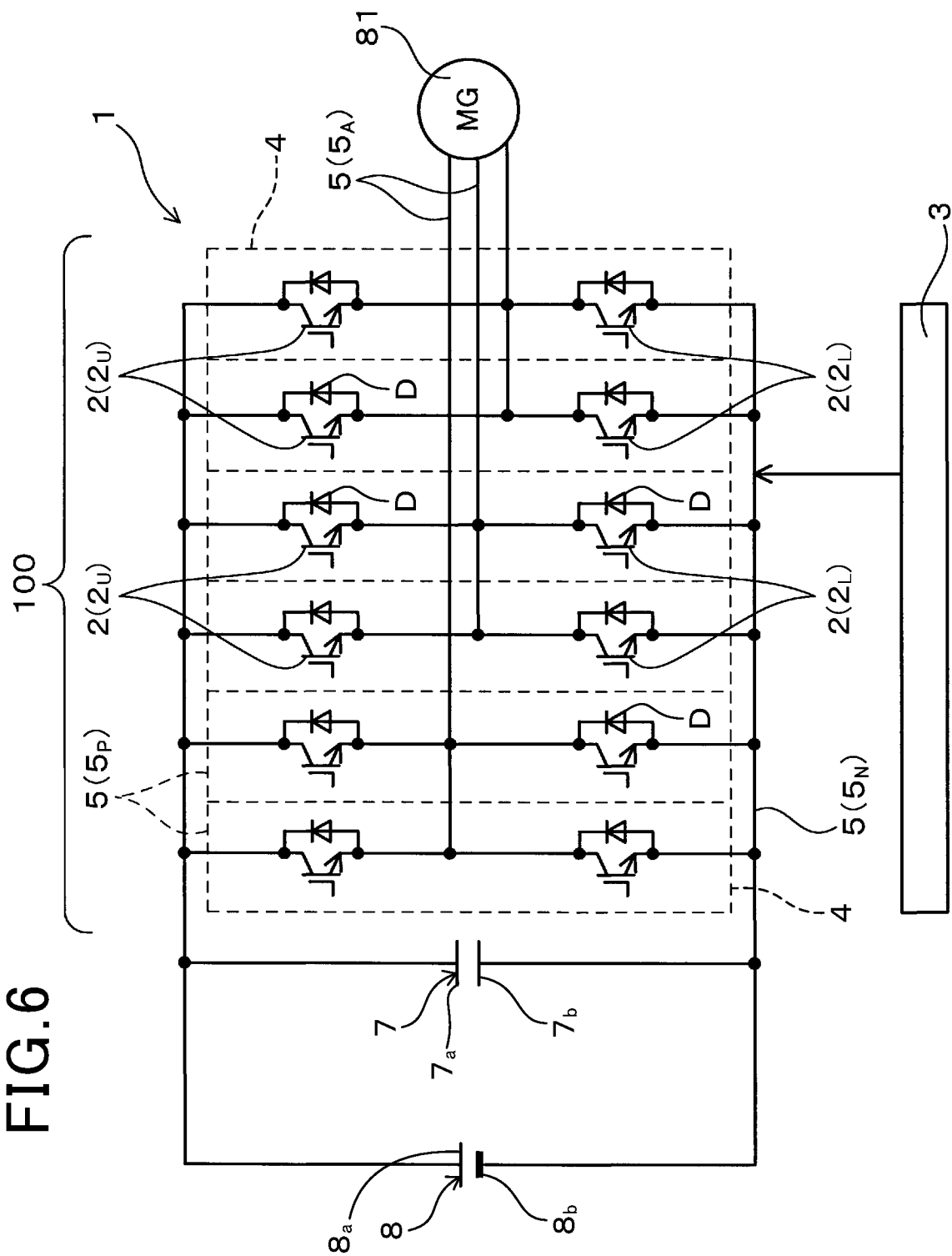
FIG. 6 is an overall circuit diagram of the power converter illustrated in FIG. 1.

Referring to FIGS. 1 and 6, the power converter 1 of the first embodiment includes plural sets of first and second switching elements 2 ($2_A$, $2_B$) connected in parallel to each other. The first and second switching elements 2 ($2_A$, $2_B$) of each set are for example configured to be simultaneously turned on or off, making it possible for each set of the first and second switching elements 2 ($2_A$, $2_B$) to output a larger output current even if each of the first and second switching elements outputs a small current as compared with an output current from a single switching element.

The power converter 1 also includes a control circuit 3 for controlling the first and second switching elements 2 of each switch set. That is, the first and second switching elements 2 ($2_A$, $2_B$) constitute each switch set. Note that the first and second switching elements 2 ($2_A$ and $2_B$) can be collectively called "first and second switching elements 2" or "first and second switching elements 2 ($2_A$ and $2_B$), or also individually called "first and second switching elements $2_A$ and $2_B$" hereinafter. The first and second switching elements 2 of each switch set are controllably connected to the control circuit 3. The control circuit 3 is configured to control on-off switching operations of each switching element 2 to thereby convert input power, such as DC power, input thereto into controlled power, such as controlled AC power.

Referring to, for example, FIG. 1, each switching element 2 includes a control electrode $21_g$, a reference electrode $21_e$, and an input electrode $21_d$. For example, the first embodiment uses an IGBT as each switching element 2, so that the control electrode $21_g$ corresponds to the gate of the IGBT, the reference electrode $21_e$ corresponds to the emitter of the IGBT, and the input electrode $21c$ corresponds to the collector of the IGBT.

Figure 9:
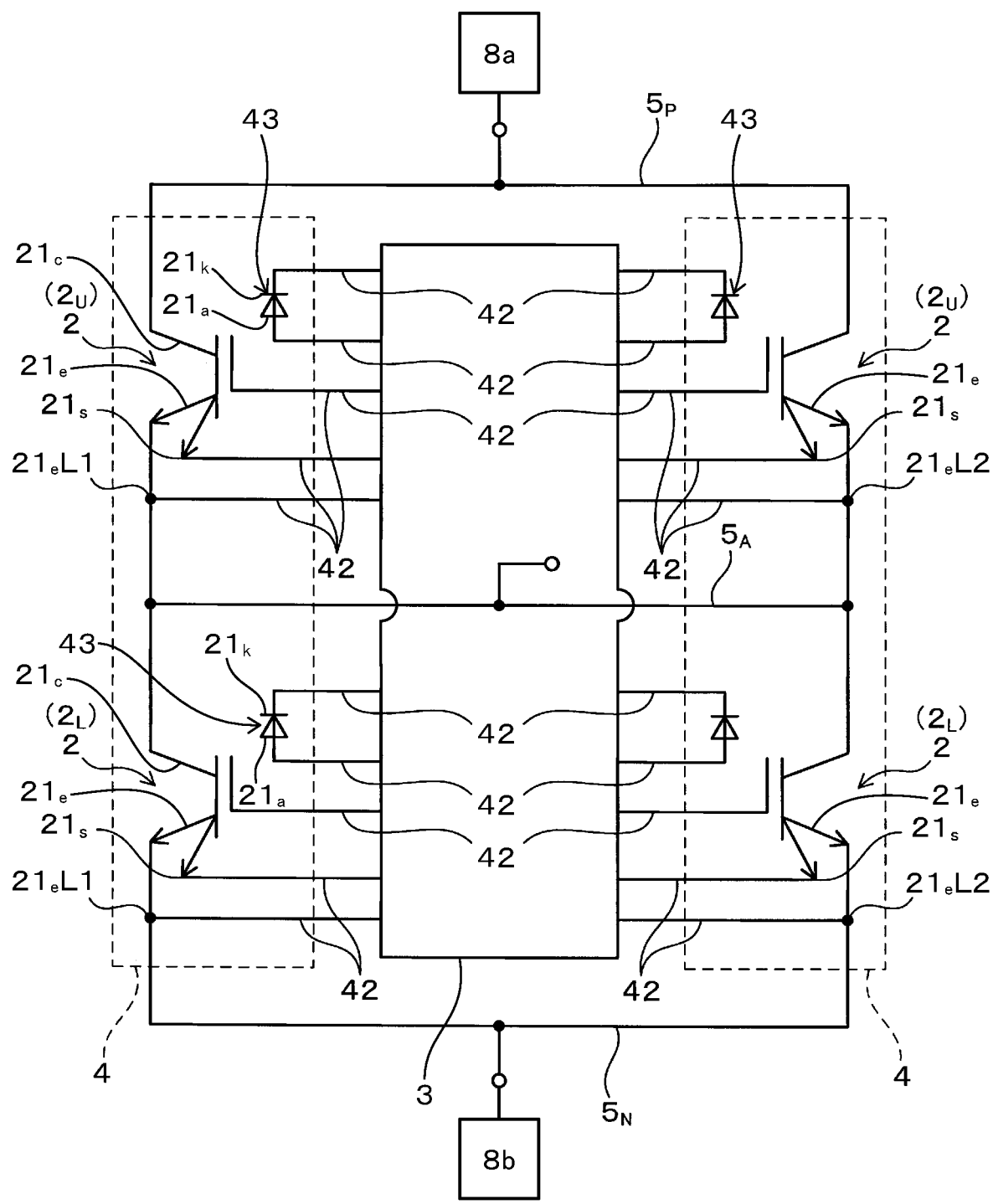
FIG. 9 is a detailed circuit diagram of each of switch units of the power converter illustrated in FIG. 1.

Although it is unillustrated in FIG. 1 for the sake of simply illustration of each switching element 2, each switching element 2 also includes a sense electrode $21_s$ (see FIG. 9).

Additionally, although it is unillustrated in FIG. 1 for the sake of simply illustration of each switching element 2 ($2_A$, $2_B$), each switching element 2 ($2_A$, $2_B$) includes a flyback diode D (see FIG. 6) connected in antiparallel thereto.

Applying a control voltage $Vi_n$ to the control electrode $21_g$ of a selected one of the first and second switching elements $2_A$ and $2_B$ enables the selected one of the first and second switching elements $2_A$ and $2_B$ to be turned on, and stopping an application of the control voltage $Vi_n$ to the control electrode $21_g$ of the selected one of the first and second switching elements $2_A$ and $2_B$ enables the selected one of the first and second switching elements $2_A$ and $2_B$ to be turned off. When a direct-current (DC) power source is connected to the input electrode $21_d$ of each switching element 2 while the switching element 2 is in an on state, the potential at the control electrode $21_g$ relative to the reference electrode $21_e$ based on a DC voltage of the DC power source causes a current, i.e. an on current $I_1$, $I_2$ to flow through the corresponding one of the first and second switching elements $2_A$ and $2_B$. That is, the reference electrode $21_e$ serves as a reference potential for the potential of the control electrode $21_g$.

The first switching element $2_A$ has a first capacitance $C_{ge1}$ between the control electrode $21_g$ and the reference electrode $21_e$ of the first switching element $2_A$, and the second switching element $2_B$ has a second capacitance $C_{ge2}$ between the control electrode $21_g$ and the reference electrode $21_e$ of the second switching element $2_B$.

Each switch unit 4 includes a feedback wiring 89 and a feedback resistor $R_{fb}$ provided in the feedback wiring 89. The feedback resistor 89 has first and second ends. The control electrode $21_g$ of the first switching element $2_A$ is connected to the first end of the feedback resistor $R_{fb}$ via a first part of the feedback wiring 89, and the control electrode $21_g$ of the second switching element $2_B$ is connected to the second end of the feedback resistor $R_{fb}$ via a second part of the feedback wiring 89. Note that reference character $R_{fb}$ of the feedback resistor $R_{fb}$ can also be used to show a resistance of the feedback resistor $R_{fb}$.

Note that the feedback wiring 89 and the feedback resistor $R_{fb}$ constitute, for example, a feedback route FR between the control electrode $21_g$ of the first switching element $2_A$ and the control electrode $21_g$ of the second switching element $2_B$.

There are inter-electrode resistances $r_p$, each of which is parasitic between the corresponding one of the first and second parts of the feedback wiring 89 and the corresponding one of the first and second switching elements $2_A$ and $2_B$.

The control circuit 3 is configured as a substantially rectangular plate-like control circuit board having opposing first and second major surfaces 39 to at least one of which various circuit components are mounted.

Figure 2:
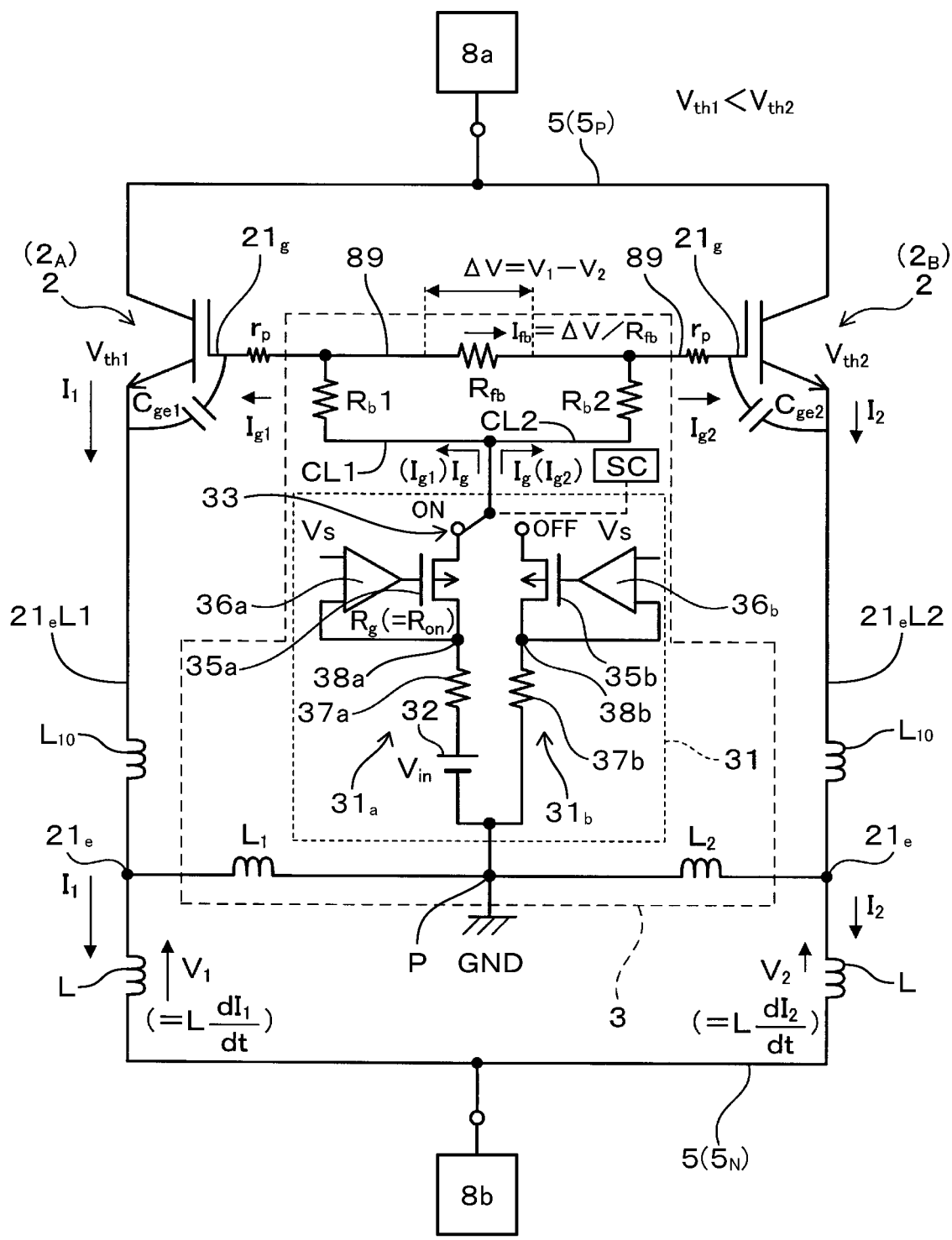
FIG. 2 is a circuit diagram schematically illustrating the selected components of the power converter according to the first embodiment of the present disclosure.
Figure 3:
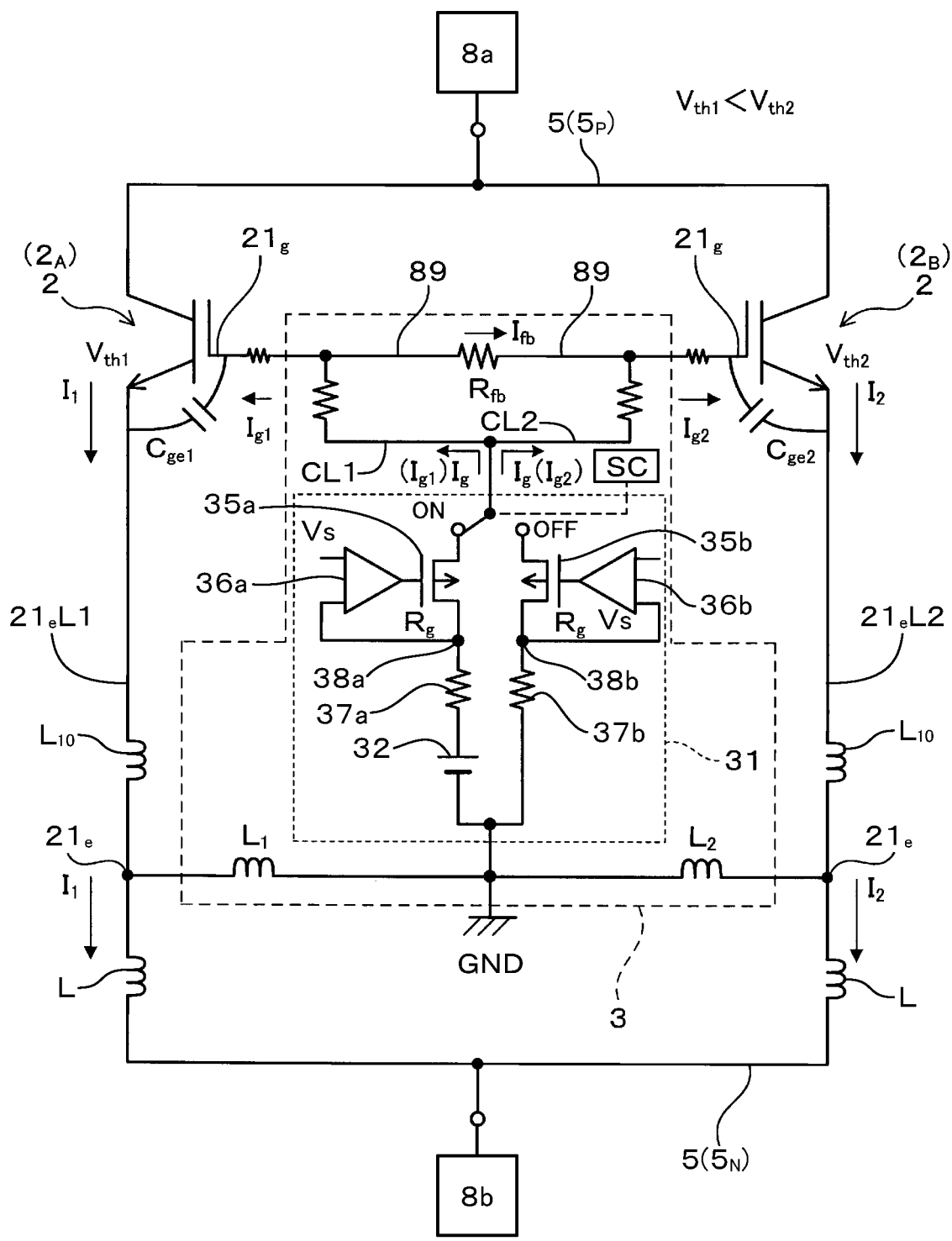
FIG. 3 is a circuit diagram schematically illustrating the selected components of the power converter according to the first embodiment of the present disclosure.
Figure 4:
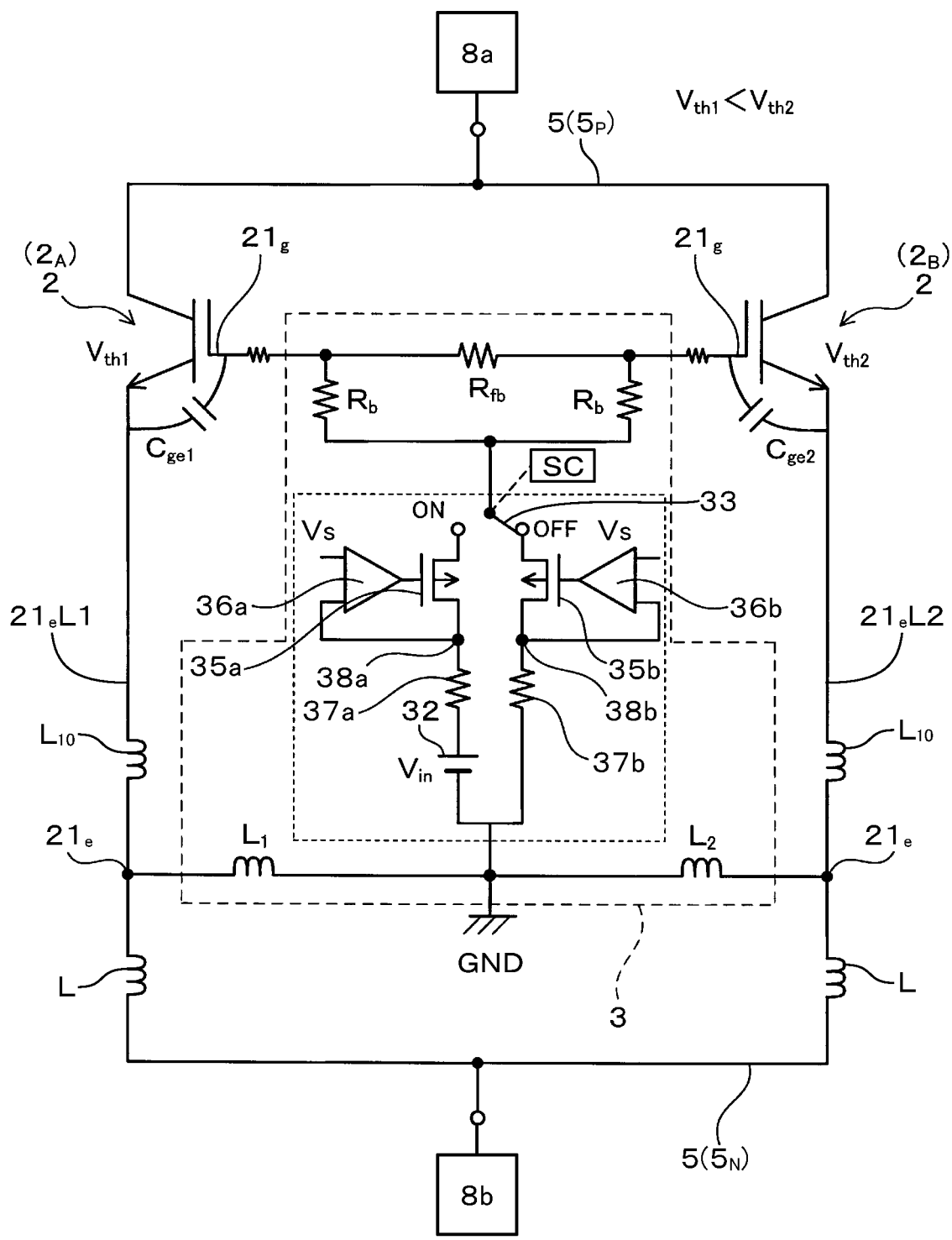
FIG. 4 is a circuit diagram schematically illustrating selected components of a power converter according to the first embodiment of the present disclosure while the first and second switching elements are in an off state.

The control circuit 3 includes a plurality of, i.e. six, drive units 31, provided for the respective switch sets, i.e. six switch sets, and a switch controller SC controllably connected to the respective drive units 31. Note that each of FIGS. 2 to 4 schematically illustrates a selected one of the switch set, the corresponding driver 31, and the switch controller SC.

Each drive unit 31 is comprised of a first driver 31a, a second driver 31b, and a selection switch 33. The first driver 31a includes a first balance resistor $R_b1$, a first drive switch 35a, a first operational amplifier 36a, a first shunt resistor 37a, and a drive power source 32. The second driver 31b includes a second balance resistor $R_b2$, a second drive switch 35b, a second operational amplifier 36b, and a second shunt resistor 37b.

For example, the first embodiment uses a MOSFET as each of the first and second drive switches 35a and 35b.

Each of the first and second balance resistors $R_b1$ and $R_b2$ has opposing first and second ends, and each of the first and second shunt resistors 37a and 37b also has opposing first and second ends. Each of the first and second operational amplifiers 36a and 36b has a non-inverting input terminal, an inverting input terminal, and an output terminal. The drive power source 32 serves as a DC power source having opposing positive and negative terminals and having a terminal voltage $Vi_n$ thereacross.

The first end of the first balance resistor $R_b1$ is connected to the control electrode $21_g$ of the first switching element 2A, and the second end of the first balance resistor $R_b1$ is connected to the drain of the first drive switch 35a via the selection switch 33. The gate of the first drive switch 35a is connected to the output terminal of the first operational amplifier 36a.

Note that a connection line connecting between the selection switch 33 and the control electrode $21_g$ of the first switching element $2_A$ can also be referred to as a first connection line CL1.

The source of the first drive switch 35a and the first end of the first shunt resistor 37a are connected to each other. The connection point 38a between the source of the first drive switch 35a and the first end of the first shunt resistor 37a is connected to the inverting input terminal of the first operational amplifier 36a. To the non-inverting input terminal of the first operational amplifier 36a, a predetermined constant voltage Vs is configured to be applied. The second end of the first shunt resistor 37a is connected to the positive terminal of the drive power source 32, and the negative terminal of the drive power source 32 is connected to a predetermined common signal ground GND of the control circuit 3.

Similarly, the first end of the second balance resistor $R_b2$ is connected to the control electrode $21_g$ of the second switching element $2_B$, and the second end of the second balance resistor $R_b2$ is connected to the drain of the second drive switch 35b. The gate of the second drive switch 35b is connected to the output terminal of the second operational amplifier 36b via the selection switch 33.

Note that a connection line connecting between the selection switch 33 and the control electrode $21_g$ of the second switching element $2_B$ can also be referred to as a second connection line CL2.

The source of the second drive switch 35b and the first end of the second shunt resistor 37b are connected to each other. The connection point between the source of the second drive switch 35b and the first end of the second shunt resistor 37b is connected to the inverting input terminal of the second operational amplifier 36b. To the non-inverting input terminal of the second operational amplifier 36b, the predetermined constant voltage Vs is configured to be applied. The second end of the second shunt resistor 37b is connected to the predetermined common signal ground GND of the control circuit 3. Note that the terminal voltage $Vi_n$ of the DC power source 32 is set to a predetermined value higher than the constant voltage Vs.

The selection switch 33 includes a stationary contact connected to the second end of each of the first and second balance resistors $R_b1$ and $R_b2$. The selection switch 33 also includes a first contact ON connected to the drain of the first drive switch 35a, and includes a second contact OFF connected to the drain of the second drive switch 35b. The switch controller SC is controllably connected to the selection switch 33, and is configured to cause the selection switch 33 to select any of the first contact ON and the second contact OFF to be connected to the stationary contact. That is, the switch controller 33 is capable of instructing the selection switch 33 to select the pair of the first and second switching elements $2_A$ and $2_B$ to be connected to any of the first driver 31a and the second driver 31b.

That is, for turning on the first and second switching elements $2_A$ and $2_B$ of each switch set, the switch controller SC causes the selection switch 33 to select the first contact ON so that the first driver 31a is connected to the stationary contact, i.e. connected to the control electrode $21_g$, of each of the first and second switching elements $2_A$ and $2_B$ (see FIG. 1). This causes the first driver 31a to supply a control current $I_g$ to the control electrode $21_g$ of each of the first and second switching elements $2_A$ and $2_B$, thus turning on the first and second switching elements $2_A$ and $2_B$.

Note that the control current $I_g$ to be supplied to the control electrode $21_g$ of the first switching element $2_A$ will also be individually referred to as a control current $I_{g1}$, and similarly, the control current $I_g$ to be supplied to the control electrode $21_g$ of the second switching element $2_B$ will also be individually referred to as a control current $I_{g}$.

How the first driver 31a works to supply the control current $I_g$ to the control electrode $21_g$ of each of the first and second switching elements $2_A$ and $2_B$ will be described in detail later.

The first and second balance resistors $R_b1$ and $R_b2$ are adjusted to reduce an imbalance between the control currents $I_{g1}$ and $I_{g2}$ flowing through the respective first and second balance resistors $R_b1$ and $R_b2$ due to, for example, an imbalance between the inter-electrode resistances $r_p$ of the respective first and second switching elements $2_A$ and $2_B$.

For turning off the first and second switching elements $2_A$ and $2_B$ of each switch set, the switch controller SC causes the selection switch 33 to select the second contact OFF so that the second driver 31b is connected to the stationary contact, i.e. connected to the control electrode $21_g$ of each of the first and second switching elements $2_A$ and $2_B$ (see FIG. 4). This causes the second driver 31b to discharge a current, i.e. a discharge current, from the control electrode $21_g$ of each of the first and second switching elements $2_A$ and $2_B$, thus turning off the first and second switching elements $2_A$ and $2_B$.

For example, the switch controller SC for the first and second switching elements $2_A$ and $2_B$ of each switch set is configured to instruct the selection switch 31 to alternately select the first contact ON and the second contact OFF to thereby turn on both the corresponding first and second switching elements $2_A$ and $2_B$ every predetermined switching cycle.

Let us assume that the first and second switching elements $2_A$ and $2_B$ according to the first embodiment respectively have first and second threshold voltages $V_{th1}$ and $V_{th2}$ that vary. In particular, the first threshold voltage $V_{th1}$ of the first switching element $2_A$ is lower than the second threshold voltage $V_{th2}$ of the second switching element $2_B$. This results in a gate voltage of the first switching element $2_A$ reaching the first threshold voltage $V_{th1}$ faster than a gate voltage of the second switching element $2_B$ reaching the second threshold voltage $V_{th2}$ in response to turning-on operation for the first and second switching elements $2_A$ and $2_B$. This results in the on current $I_1$ flowing through the first switching element $2_A$ faster than the on current $I_2$ flowing through the second switching element $2_B$.

For example, as illustrated in FIG. 6, the six switch sets are divided into a first group of three switch sets, and a second group of three switch sets.

The three switch sets in the first group respectively serve as three-phase (U-, V-, and W-phase) upper-arm switch sets, which will be referred to respectively as upper-arm switch sets. That is, each of the three-phase upper-arm switch sets is comprised of (1) The first and second switching elements 2 connected in parallel to each other (2) Free-wheeling or flyback diodes D connected in antiparallel to the respective first and second switching elements 2

Similarly, the three switch sets in the second group respectively serve as three-phase (U-, V-, and W-phase) lower-arm switch sets, which will be referred to respectively as lower-arm switch sets. That is, each of the three-phase lower-arm switch sets is comprised of (1) The first and second switching elements 2 connected in parallel to each other (2) Free-wheeling or flyback diodes D connected in antiparallel to the respective first and second switching elements 2

In particular, the first switching element $2_A$ included in each phase upper-arm switch set is connected in series to the first switching element $2_A$ included in the corresponding phase lower-arm switch set (see FIG. 6). Similarly, the second switching element $2_B$ included in each phase upper-arm switch set is connected in series to the second switching element $2_B$ included in the corresponding phase lower-arm switch set (see FIG. 6).

As illustrated in FIG. 6, the power converter 1, a DC power source, i.e. a battery, 8, a smoothing capacitor 7, and a three-phase AC motor-generator (MG) 82 constitute a power conversion system CS. The power converter 1 is operative to convert input power, such as DC power, supplied from the battery 8 into controlled power, such as controlled AC power, to be applied to the MG 82. The MG 82 includes three-phase coils each having opposing first and second ends.

The DC power source 8 has opposing positive and negative terminals 8a and 8b, and the smoothing capacitor 7 has opposing positive and negative electrodes 7a and 7b. The positive terminal 8a of the DC power source 8 is connected to the positive electrode 7a of the smoothing capacitor 7, and the positive electrode 7a of the smoothing capacitor 7 is connected to a positive busbar $5_P$ (see, for example, FIGS. 1 and 6). Additionally, the negative terminal 8b of the DC power source 8 is connected to the negative electrode 7b of the smoothing capacitor 7, and the negative electrode 7b of the smoothing capacitor 7 is connected to a negative busbar $5_N$ (see, for example, FIGS. 1 and 6).

The input electrodes $21_d$ of the first and second switching elements $2_A$ and $2_B$ included in each phase upper-arm switch set are connected to the positive busbar $5_P$, and the reference electrodes $21_e$ of the first and second switching elements $2_A$ and $2_B$ included in each phase lower-arm switch set are connected to the negative busbar $5_N$.

The connection point between the reference electrode $21_e$ of the first switching element $2_A$ of each phase upper-arm switch set and the input electrode $21_e$ of the first switching element $2_A$ of the corresponding lower-arm switch set are connected to the first end of the corresponding phase coil of the MG 81. Similarly, the connection point between the reference electrode $21_e$ of the second switching element $2_B$ of each phase upper-arm switch set 2U1 and the input electrode $21_e$ of the second switching element $2_B$ of the corresponding lower-arm switch set are connected to the first end of the corresponding phase coil of the MG 81.

The second ends of the three-phase coils of the MG 81 are commonly connected to each other in, for example, star-configuration; the common connection point serves as a neutral point.

Next, the following describes how each drive unit 31 works to drive the corresponding first and second switching elements $2_A$ and $2_B$ under control of the switch controller SC.

The drive unit 31 is comprised of the first driver 31a and the second driver 31b, and the first driver 31a is configured as a constant current circuit for supplying the control current $I_g$ having a predetermined constant level to the control electrode $21_g$ of each of the first and second switching elements $2_A$ and $2_B$.

For turning on the first and second switching elements $2_A$ and $2_B$, the switch controller SC instructs the selection switch 33 to select the first contact ON, so that the first driver 31a is connected to the control electrode $21_g$ of each of the first and second switching elements $2_A$ and $2_B$ via the drive switch 35a.

As is known in the art, the first operational amplifier 36a is configured such that their non-inverting and inverting input terminals are virtually short-circuited. This results in the first operational amplifier 36a causing the potential at the non-inverting input terminal to be the same as the potential at the inverting input terminal. Because the connection point 38a between the source of the first drive switch 35a and the first end of the first shunt resistor 37a is connected to the inverting input terminal of the first operational amplifier 36a, the first operational amplifier 36a turns on the first drive switch 35a to thereby cause the potential at the connection point 38a to be identical to the constant voltage Vs inputted to the non-inverting input terminal of the first operational amplifier 36a.

This results in the constant voltage Vs being applied across the shunt resistor 37, resulting in the control current $I_g$ with the constant level flowing through the shunt resistor 37 to the control electrode $21_g$ of each of the first and second switching elements $2_A$ and $2_B$. The control current $I_g$ serves to charge each of the first and second capacitances $C_{ge1}$ and $C_{ge2}$ of the corresponding one of the first and second switching elements $2_A$ and $2_B$.

Figure 5:
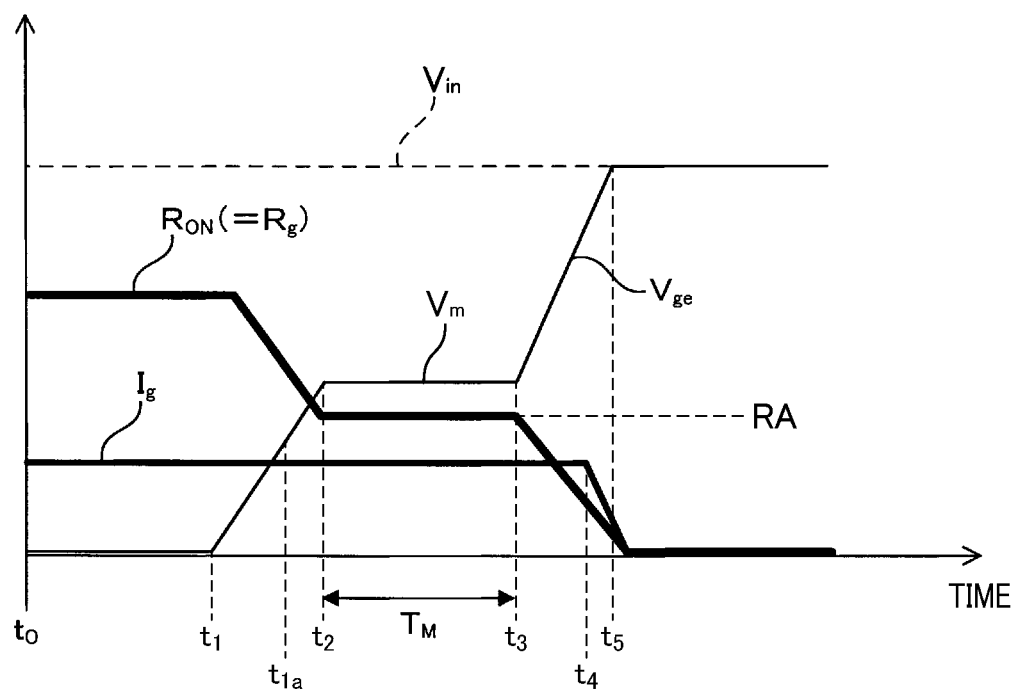
FIG. 5 is a graph schematically illustrating how a gate voltage and a control current for each of the first and second switching elements and an on resistance of a drive switch are changed over time.

Specifically, as illustrated in FIG. 5, when the switch controller SC instructs the selection switch 33 to select the first contact ON at time t0, the control current $I_g$ starts to flow from the DC power source 32 to the control electrode $21_g$ of each of the first and second switching elements $2_A$ and $2_B$ via the shunt resistor 37a and the drive switch 35a.

The drive switch 35a has an on-resistance $R_{on}$, which serves as a speed adjustment resistance $R_g$, which is expressed by the following equation "$R_g=(V_{in}-V_{ge})/I_g$" where $V_{ge}$ represents a gate voltage or a gate-emitter voltage, $V_{ge}$ of each switching element $2_A$, $2_B$.

That is, the on-resistance $R_{on}$, that is, the speed adjustment resistance $R_g$, of the drive switch 35a is configured to limit the control current $I_g$ flowing to the control electrode $21_g$ of each of the first and second switching elements $2_A$ and $2_B$, thus adjusting the switching speed of the corresponding one of the first and second switching elements $2_A$ and $2_B$.

The above equation makes clear that the on-resistance $R_{on}$ of the drive switch 35a varies depending on the gate voltage $V_{ge}$ of each switching element $2_A$, $2_B$.

That is, when each of the first and second capacitances $C_{ge1}$ and $C_{ge2}$ of the corresponding one of the first and second switching elements $2_A$ and $2_B$ has charged to a predetermined value at time t1, the gate voltage $V_{ge}$ of each switching element $2_A$, $2_B$ starts to gradually increase, so that the on-resistance $R_{on}$ of the drive switch 35a starts to gradually decrease in inverse proportion to the gate voltage $V_{ge}$, and a collector voltage $V_{ce}$ of each switching element $2_A$, $2_B$ also starts to gradually decrease. While the on-resistance $R_{on}$ of the drive switch 35a gradually decreases, the control current $I_g$ is maintained at the constant level. When the gate voltage $V_{ge}$ of each switching element $2_A$, $2_B$ has reached the corresponding one of the first and second threshold voltages $V_{th1}$ and $V_{th2}$ at time t1a, each switching element $2_A$, $2_B$ is turned on. This results in the on current $I_1$ flowing through the first switching element $2_A$ and the on current $I_2$ flowing through the second switching element $2_B$.

When the collector voltage $V_{ce}$ of each switching element $2_A$, $2_B$ becomes equal to the gate voltage $V_{ge}$ thereof at time t2, the gate voltage $V_{ge}$ of each switching element $2_A$, $2_B$ remains at a predetermined constant voltage, i.e. a Miller voltage $V_M$ while the collector voltage $V_{ce}$ continuously decreases during a predetermined period $T_M$ that will be referred to as a Miller period.

When the Miller period $T_M$ has elapsed since the time t2, the gate voltage $V_{ge}$ of each switching element $2_A$, $2_B$ starts to gradually increase again at time t3. Thereafter, when the gate voltage $V_{ge}$ has reached a predetermined value so that each of the first and second capacitances $C_{ge1}$ and $C_{ge2}$ of the corresponding switching element $2_A$, $2_B$ has been, for example, fully charged at time t4, the control current $I_g$ starts to gradually decrease. Finally, the gate voltage $V_{ge}$ of each switching element $2_A$, $2_B$ reaches the terminal voltage $Vi_n$ of the drive power source 32 at time t5, and each of the control current $I_g$ and the on-resistance $R_{on}$ of the drive switch 35a reaches a corresponding zero level.

In contrast, when the switch controller SC instructs the selection switch 33 to select the second contact OFF while each switching element $2_A$, $2_B$ is in the on state, a constant discharge current starts to be discharged from the corresponding one of the first and second capacitances $C_{ge1}$ and $C_{ge2}$, and the constant discharge current flows to the common signal ground GND via the second driver 31b.

At that time, like the first operational amplifier 36a, the second operational amplifier 36b turns on the second drive switch 35b to thereby cause the potential at the connection point 38b to be identical to the constant voltage Vs inputted to the non-inverting input terminal of the second operational amplifier 36b.

This therefore results in the constant discharge current flowing through the second drive switch 35b and the second shunt resistor 37b to the common signal ground GND of the control circuit 3, so that the gate voltage $V_{ge}$ of each switching element $2_A$, $2_B$ starts to gradually decrease, and the collector voltage $V_{ce}$ of each switching element $2_A$, $2_B$ gradually increases in reverse proportional to the gate voltage $V_{ge}$.

When the collector voltage $V_{ce}$ of each switching element $2_A$, $2_B$ becomes equal to the gate voltage $V_{ge}$ thereof, the gate voltage $V_{ge}$ of each switching element $2_A$, $2_B$ remains at the Miller voltage $V_M$ while the collector voltage $V_{ce}$ continuously increases during the Miller period $T_M$.

When the Miller period $T_M$ has elapsed since the timing of the collector voltage $V_{ce}$ of each switching element $2_A$, $2_B$ becoming equal to the gate voltage $V_{ge}$, the gate voltage $V_{ge}$ of each switching element $2_A$, $2_B$ starts to gradually decreases again. When the gate voltage $V_{ge}$ of each switching element $2_A$, $2_B$ has passed the corresponding one of the first and second threshold voltages $V_{th1}$ and $V_{th2}$, each switching element $2_A$, $2_B$ is turned off.

Thereafter, the gate voltage $V_{ge}$ has reached a predetermined value so that each of the first and second capacitances $C_{ge1}$ and $C_{ge2}$ of the corresponding switching element $2_A$, $2_B$ has been, for example, fully discharged, and the gate voltage $V_{ge}$ of each switching element $2_A$, $2_B$ reaches the corresponding zero level.

In particular, the resistance of the feedback resistor $R_{fb}$ existing between the control electrodes $21_g$ of the first and second switching elements $2_A$ and $2_B$ is set to be lower than a value RA of the on-resistance $R_{on}$ of the drive switch 35a; the on-resistance $R_{on}$ of the drive switch 35a takes the value RA when the gate voltage $V_{ge}$ of each switching element $2_A$, $2_B$ has been held to the Miller voltage $V_M$, i.e., held within the Miller period $T_M$.

As described above, turning on of the first and second switching elements $2_A$ and $2_B$ enable the on currents $I_1$ and $I_2$ to flow through the respective first and second switching elements $2_A$ and $2_B$, and the on currents $I_1$ and $I_2$ consequently flow through the negative busbar $5_N$.

As illustrated in, for example, FIG. 1, the power converter 1 includes, for each first switching element $2_A$, a first reference line, i.e. a first emitter line, $21_eL1$ connecting between the first switching element $2_A$ and the negative busbar $5_N$ via the reference electrode $21_e$. The power converter 1 includes, for each second switching element $2_B$, a second reference line, i.e. a second emitter line, $21_eL2$ connecting between the second switching element $2_B$ and the negative busbar $5_N$ via the reference electrode $21_e$. The first and second reference lines $21_eL1$ and $21_eL2$, i.e. the first and second reference electrodes $21_e$ of the first and second switching elements $2_A$ and $2_B$, are commonly connected to each other via a wiring 34, and the wiring 34 is connected at a point P to the common signal ground GND of the control circuit 3. The wiring 34 has a parasitic inductance L1 between the reference electrode $21_e$ and the point P, and a parasitic inductance L2 between the reference electrode $21_e$ and the point P.

The first reference line $21_eL1$ has a first parasitic inductance, and the second reference line $21_eL2$ has a second parasitic inductance. The first and second parasitic inductances according to the first embodiment are set to be equal to each other, each of which being assigned with L.

This causes a voltage V1, which is expressed by $LdI_1/dt$, to be induced across the first parasitic inductance L, and also causes a voltage V2, which is expressed by $LdI_2/dt$, to be induced across the second parasitic inductance L.

Note that a reference character L10 represents a parasitic inductance between each switching element and the corresponding reference electrode $21_e$, and a value of the parasitic inductance L10 is ignored because the value of the parasitic inductance L10 is small.

That is, the reference electrode $21_e$ of the first switching element $2_A$ is connected to the negative busbar $5_N$, i.e. the negative terminal 8b of the DC power source 8; the negative terminal 8b of the DC power source 8 has a reference potential, i.e. a ground potential, of, for example, 0 V. Similarly, the reference electrode $21_e$ of the second switching element $2_B$ is connected to the negative busbar $5_N$, i.e. the negative terminal 8b of the DC power source 8.

As described above, because the on current $I_1$ flowing through the first switching element $2_A$ faster than the on current $I_2$ flowing through the second switching element $2_B$, the voltage $V_1$ across the parasitic inductance L for the reference electrode $21_e$ of the first switching element $2_A$, which is expressed by $LdI_1/dt$, is larger than the voltage $V_2$ across the parasitic inductance L for the reference electrode $21_e$ of the second switching element $2_B$, which is expressed by $LdI_2/dt$.

The difference between the voltage $V_1$ for the reference electrode $21_e$ of the first switching element $2_A$ and the voltage $V_2$ for the reference electrode $21_e$ of the second switching element $2_B$, which represents that the voltage $V_1$ is higher than the voltage $V_2$, causes a current to flow from the reference electrode $21_e$ of the first switching element $2_A$ to the reference electrode $21_e$ of the second switching element $2_B$ via the point P. This causes a voltage to be induced across each of the parasitic inductances L1 and L2, resulting in a potential at the reference electrode $21_e$ of the first switching element $2_A$ being higher than a potential at the reference electrode $21_e$ of the second switching element $2_B$.

This therefore causes a feedback current $I_{fb}$ to flow from the reference electrode $21_e$ of the first switching element $2_A$ to the reference electrode $21_e$ of the second switching element $2_B$. Specifically, the feedback current $I_{fb}$ flows from the reference electrode $2_e1$ of the first switching element $2_A$ to the reference electrode $21_e$ of the second switching element $2_B$ via the first capacitance $C_{ge1}$, the feedback resistor $R_{fb}$, and the second capacitance $C_{ge2}$ in this order.

This feedback current $I_{fb}$ flowing from the reference electrode $21_e$ of the first switching element $2_A$ to the reference electrode $21_e$ of the second switching element $2_B$ enables the control current $I_{g1}$, which flows from the first driver $31a$ to the control electrode $21_g$ of the first switching element $2_A$ via the first connection line CL1 to decrease. This suppresses an increase in the on current $I_1$. In contrast, this feedback current $I_{fb}$ flowing from the reference electrode $21_e$ of the first switching element $2_A$ to the reference electrode $21_e$ of the second switching element $2_B$ enables the control current $I_{g2}$, which flows from the first driver $31a$ to the control electrode $21_g$ of the second switching element $2_B$ via the second connection line CL2 to increase. This enables the on current $I_2$ to be likely to increase.

That is, as illustrated in FIG. 3, the feedback route FR, which is comprised of the feedback wiring 89 and the feedback resistor $R_{fb}$, between the control electrode $21_g$ of the first switching element $2_A$ and the control electrode $21_g$ of the second switching element $2_B$ enables the difference between the on currents $I_1$ and $I_2$ to be smaller.

As described above, the power converter 1 is configured such that each drive unit 31 feeds a current based on the difference between the voltage $V_1$, which is expressed by $LdI_1/dt$, related to the first switching element $2_A$ and the voltage V2, which is expressed by LdI2/dt, related to the second switching element $2_B$ back to the control electrode $21_g$ of a selected one of the first and second switching elements $2_A$ and $2_B$; the voltage related to the control electrode $21_g$ of the selected one of the first and second switching elements $2_A$ and $2_B$ is smaller than the voltage related to the control electrode $21_g$ of the other thereof.

This configuration therefore enables the difference between the on currents $I_1$ and $I_2$ for the respective first and second switching elements $2_A$ and $2_B$ to be smaller, resulting in the on currents $I_1$ and $I_2$ balancing with each other.

Like turning on of the first and second switching elements $2_A$ and $2_B$, this configuration of the power converter 1 enables the difference between the discharge currents flowing from the respective switching elements $2_A$ and $2_B$ for turning off the switching elements $2_A$ and $2_B$ to balance with each other.

Note that each of the voltage $LdI_1/dt$ and the voltage LdI2/dt has a lower frequency than a switching frequency of both the first and second switching elements $2_A$ and $2_B$. In addition, the frequency and/or magnitude of each of the voltage $LdI_1/dt$ and the voltage LdI2/dt may vary depending on, for example, the corresponding one of the on currents $I_1$ and $I_2$ and/or the temperature of the corresponding one of the first and second switching elements $2_A$ and $2_B$. For this reason, each drive unit 31 is configured such that the control electrode $21_g$ of the first switching element $2_A$ and the control electrode $21_g$ of the second switching element $2_B$ are connected to each other via the feedback resistor $R_{fb}$, which is not a capacitor with frequency characteristics.

Figure 7:
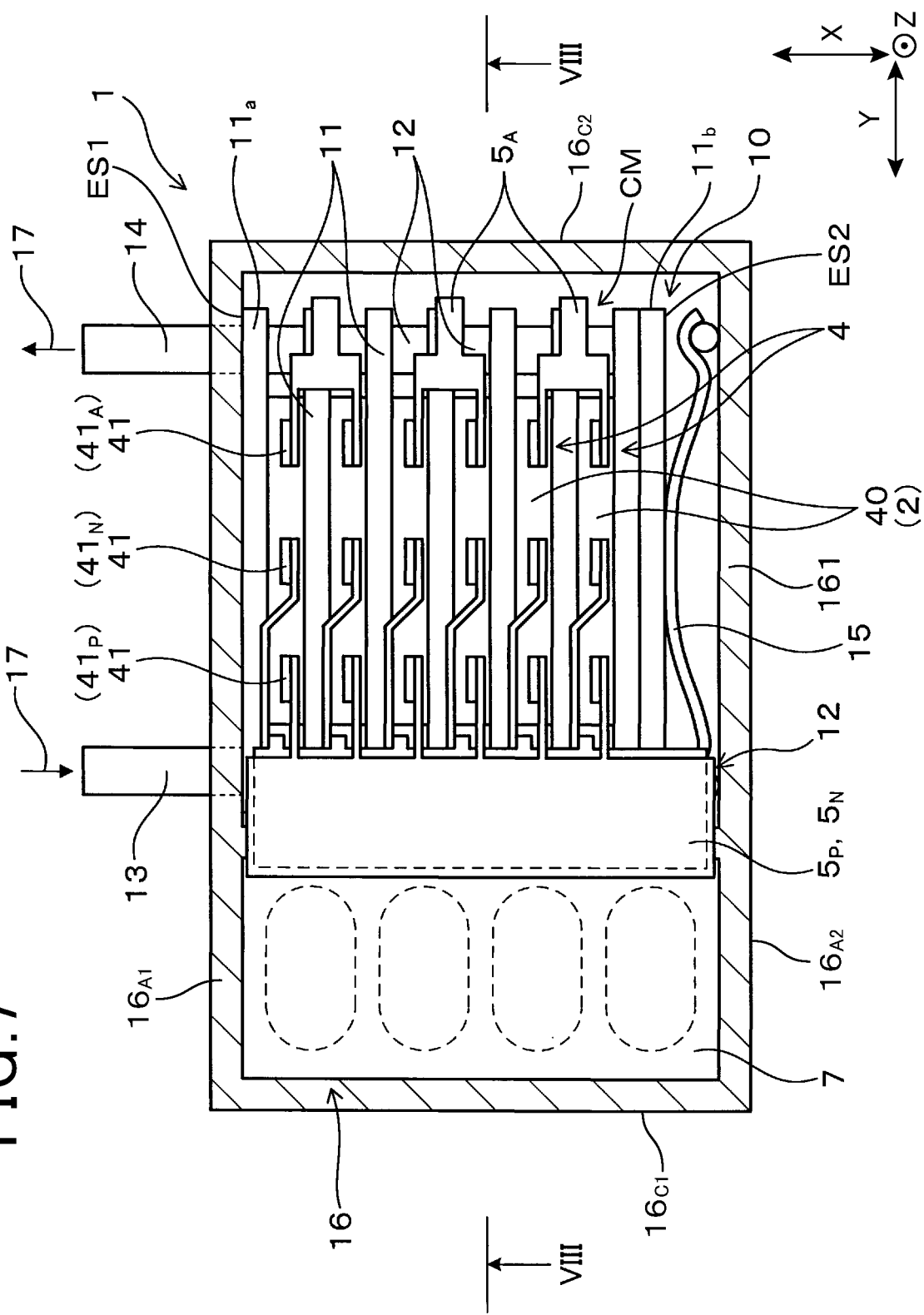
FIG. 7 is a cross-sectional view of the power converter illustrated in FIG. 1, which is taken along line VIII-VII in FIG. 8.
Figure 8:
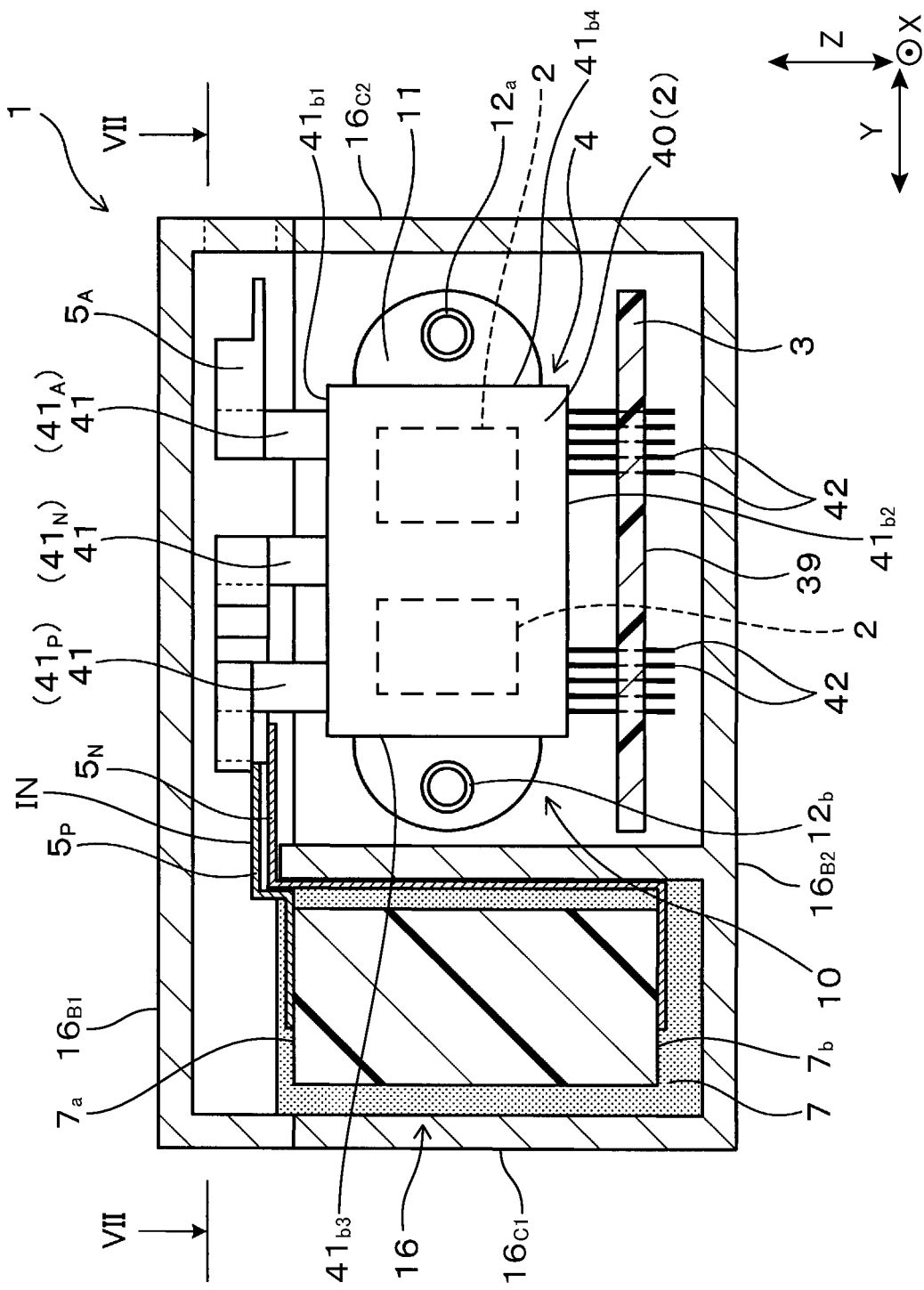
FIG. 8 is a cross-sectional view taken along line VIII-VIII in FIG. 7.

As illustrated in FIGS. 7 and 8, the power converter 1 includes a stack assembly 10, a DC busbar assembly 5 comprised of a pair of DC busbars $5_P$ and $5_N$, an AC busbar $5_A$, the control circuit 3, the smoothing capacitor 7, and a housing 16. Note that the busbars 5 ($5_P$, $5_N$, $5_A$) can be collectively called "busbars 5" or "busbars 5 ($5_P$, $5_N$, $5_A$), or also individually called "busbars $5_P$, $5_N$, $5_A$" hereinafter.

The stack assembly 10 includes switch modules 4, each of which is comprised of an upper-arm switching element 2 and a lower-arm switching element 2, and a plurality of cooling pipes 11. The stack assembly 10 is configured such that the switch modules 4 and the cooling pipes 11 are alternately stacked in a predetermined direction, which will be referred to as a thickness direction or an X direction, to have a stack structure. The stack assembly 10 has opposing first and second end surfaces ES1 and ES2 in the X direction.

That is, the power converter 1 includes a cooling mechanism CM, which is comprised of the cooling pipes 11 and joint pipes 12, for cooling the switch modules 4.

The housing 16 has a substantially rectangular parallelepiped shape having a first pair of opposing sidewalls 16A1 and 16A2, a second pair of sidewalls 16B1 and 16B2, and a third pair of sidewalls 16C1 and 16C2. For example, the stack assembly 10 is disposed in the housing 16 such that the first and second surfaces ES1 and ES2 of the stack assembly 10 face the respective sidewalls 16A1 and 16A2, and are disposed to be perpendicular to the X direction (stack direction) (see, for example, FIG. 7).

The stack assembly 10 and the smoothing capacitor 7 are disposed to be aligned in a direction, which will be referred to a Y direction, that is perpendicular to the X direction. The direction perpendicular to the X direction and Y direction will be defined as a Z direction hereinafter; the relationship of these X-Z directions is illustrated in, for example, FIG. 7 or FIG. 8.

The DC busbars $5_P$ and $5_N$ serve as a current path between the DC power source 8 and the switch modules 4, and the AC busbar $5_A$ serves as a current path between the semiconductor modules 4 and the MG 81.

Specifically, the positive terminal 8a of the DC power source 8 is connected to the positive electrode 7a of the smoothing capacitor 7, and the positive electrode 7a of the smoothing capacitor 7 is connected to the DC busbar $5_P$ (see FIG. 8). Additionally, the negative terminal 8b of the DC power source 8 is connected to the negative electrode 7b of the smoothing capacitor 7, and the negative electrode 7b of the smoothing capacitor 7 is connected to the DC busbar $5_N$.

The stack assembly 10, the DC busbars 5, the smoothing capacitor 7, and the control circuit 3 are installed in the housing 16 (see, for example, FIG. 7).

As illustrated in FIG. 7 and FIG. 8, each switch module 4 includes a switch component 40 incorporating, for example, packaging, therein the switching elements 2, and power terminals 41 ($41_P$, $41_N$, $41_A$) protruding from the switch component 40 and connected to the respective busbars 5 ($5_P$, $5_N$, $5_A$).

The power terminals 41 include DC terminals $41_P$ and $41_N$ connected to the respective DC busbars $5_P$ and $5_N$, and an AC terminal $41_A$ connected to the AC busbar $5_A$.

Specifically, the converter component 41 of each switch module 4 is comprised of a substantially rectangular parallelepiped case $41a$ in which the switching elements 2 are installed. The case $41a$ of the converter component 41 has opposing major surfaces, opposing major sides, i.e. longitudinal sides, $41b1$ and $41b2$, and has opposing minor sides, i.e. lateral sides, $41b3$ and $41b4$. For example, the case $41a$ of the converter component 41 is arranged such that (1) The man sides $41b1$ and $41b2$ face the respective sidewalls 16B1 and 16B2 of the housing 16

(2) The minor sides $41b3$ and $41b4$ face the respective sidewalls 16C1 and 16C2 of the housing 16

The major side $41b1$ has opposing first and second ends in the Y direction, and a middle portion between both the first and second ends.

The DC terminal $41_P$ is for example configured to protrude from the first end of the major side $41b1$ to extend by a predetermined length in the Z direction, which serves as, for example, a protrusion direction, toward the sidewall 16B1 of the housing 16; the first end is closer to the smoothing capacitor 7 than the second end is. The DC terminal $41_N$ is for example configured to protrude from the middle portion of the major side 41b1 to extend by a predetermined length in the Z direction toward the sidewall 16B 1 of the housing 16.

Additionally, the AC terminal $41_A$ is configured to protrude from the second end of the major side 41b1 to extend by a predetermined length in the Z direction toward the sidewall 16B1 of the housing 16.

The busbar assembly 5 is arranged to extend between the DC terminals 41 of the switch modules 4 and the smoothing capacitor 7 in the Y direction to electrically couple the DC terminals 41 and the smoothing capacitor 7.

Specifically, the busbar assembly 5 is comprised of the positive busbar $5_P$ and the negative busbar $5_N$, each of which has a plate-like shape and has opposing first and second ends in the Y direction, so that the first end of each of the busbars $5_P$ and $5_N$ is closer to the smoothing capacitor 7 than the second end thereof is. The busbar assembly 5 is also comprised of an insulation member IN interposed between a portion of the positive busbar $5_P$ and a portion of the negative busbar $5_N$, so that the portion of the positive busbar $5_P$ and the portion of the negative busbar $5_N$ are overlapped with each other in the Z direction.

Additionally, each switch module 4 includes control terminals 42 each having a first end connected to the corresponding one of the switching elements 2 installed in the corresponding switch module 4. Each of the control terminals 42 has a second end, which is opposite to the first end, is for example configured to protrude from the major side 41b2 of the corresponding case 41a to extend by a predetermined length in the Z direction toward the sidewall 16B2 of the housing 16. The second ends of the control terminals 42 of each switching module 4 are connected to the control circuit 3. That is, the control terminals 42 of the respective switching elements 2 installed in the stack assembly 10 are connected to the control circuit 3.

As illustrated in FIGS. 7 and 8, each of the cooling pipes 11 has a substantially rectangular plate-like shape, and has a longitudinal length in the Y direction longer than the longitudinal length of each switching module 2 in the Y direction. Referring to FIG. 7, the switch modules 4 and the cooling pips 11 are alternately arranged in the X direction to constitute the stack assembly 10 such that two cooling pipes 11a and 11b are located at both ends of the stack assembly 10 in the X direction.

Each of the cooling pipes 11 has opposing first and second ends in its longitudinal direction, i.e. the Y direction. The joint pipes 12 include first joint pipes 12a communicably connecting the first ends of the cooling pipes 11, and second joint pipes 12b communicably connecting the second ends of the cooling pipes 11. The cooling mechanism CM is arranged such that the second ends of the cooling pipes 11, which are joined by the joint pipes 12b, are located to be closer to the capacitor 7 than the first ends of the cooling pipes 11 are.

Referring to FIG. 7, the power converter 1 includes an introduction pipe 13 and an exhaust pipe 14. The cooling pipe 11a is located to be closer to the sidewall 16A1 of the housing 16 than the cooling pipe 11b is. The cooling pipe 11a has opposing first and second ends; the second end of the cooling pipe 11a is located to be closer to the capacitor 7 than the first end of the cooling pipe 11a is. In particular, the cooling pipe 11a is in direct contact with the sidewall 16A1 of the housing 16.

The introduction pipe 13 airtightly penetrates through the sidewall 16A1 of the housing 16 to be communicably connected to the second end of the cooling pipe 11a of the cooling mechanism CM. The exhaust pipe 14 is airtightly penetrated through the sidewall 16A1 of the housing 16 to be communicably connected to the first end of the cooling pipe 11a of the cooling mechanism CM. When a predetermined refrigerant, i.e. a coolant, 17 is introduced into the introduction pipe 13, the refrigerant 17 flows into all the cooling pipes 11 from their second ends via the second joint pipes 12b, and reaches the first ends of all the cooling pipes 11. Thereafter, the refrigerant 17 flows through the first joint pipes 11a to be exhausted from the exhaust pipe 14. That is, introduction of the refrigerant 17 into the cooling pipes 11 and exhaust of the refrigerant 17 from the cooling pipes 11 are repeatedly carried out, resulting in cooling of the switch modules 2.

The power converter 1 includes a pressing member 15 located between the cooling pipe 11b of the cooling mechanism CM and the inner surface of the sidewall 16A2 of the housing 16. For example, a leaf spring is used as the pressing member 15. Specifically, the pressing member 15 elastically presses the cooling pipe 11b to the opposing sidewall 16A1 of the housing 16 in the X direction, i.e. the stack direction of the switch modules 2 to thereby fixedly fasten the stack assembly 10 to the housing 16 while ensuring contact pressure between each switch module 4 and a corresponding pair of cooling pipes 11 adjacent to the switch module 4.

Next, the following describes an example of the configuration of each switch module 4 in detail with reference to FIG. 9.

Each switch module 4 incorporates therein an upper-arm switching element 2, which will be referred to as an upper-arm switching element $2_U$, and a lower-arm switching element 2, which will be referred to as a lower-arm switching element $2_L$. As illustrated in FIGS. 6 and 9, the upper-arm switching elements $2_U$ of the respective switch modules 4 are connected in parallel to each other via the positive busbar $5_P$, and the lower-arm switching elements $2_L$ of the respective switch modules 4 are connected in parallel to each other via the negative positive busbar $5_L$.

Each switching element 2 ($2_U$, $2_L$) includes the sense electrode $21_s$ in addition to the control electrode $21_g$ and the reference electrode $21_e$. Each of the control electrode $21_g$, the reference electrode $21_e$, and the sense electrode $21_s$ is connected to, for example, the first end of the corresponding control terminal 42, and the second end of the corresponding control terminal 42 is connected to the control circuit 3.

The sense electrode $21_s$ of each switching element 2 is configured to fetch a minute current, i.e. a sense current, which is a part of the on current I, flowing through the corresponding switching element 2, and send the fetched sense current to the switch controller SC of the control circuit 3. This enables the switch controller SC to measure the on current I flowing through each switching element 2.

The switch controller SC is configured to determine whether the measured on current I flowing through each switching element 2 is higher than a predetermined threshold level, and turn off or maintain off at least one of the switching elements 2 upon determining that the measured current flowing through the at least one of the switching elements 2 is higher than the predetermined threshold level. This prevents an overcurrent from flowing through each switching element 2, thus protecting the corresponding switching element 2.

Each switch module 4 also includes temperature-sensitive diodes 43 each having an anode electrode 21a and a cathode electrode $21_k$. The anode electrode $21a$ and cathode electrode $21k$ of each temperature-sensitive diode 43 are respectively connected to the control circuit 3 via the corresponding control terminals 42. Each temperature-sensitive diode 43 is located to be close to the corresponding switching element 2 such that a voltage across the corresponding temperature-sensitive diode 43 while a current is flowing therethrough varies depending on the temperature of the corresponding switching element 2.

That is, the switch controller SC is configured to cause a current to flow through each temperature-sensitive diode 43 to thereby measure a voltage across each temperature-sensitive diode 43. Then, the switch controller SC is configured to obtain the temperature of each switching element 2 in accordance with the measured voltage across the corresponding temperature-sensitive diode 43.

Additionally, the switch controller SC is configured to determine whether the obtained temperature of each switching element 2 is higher than a predetermined temperature threshold, and turn off or hold off at least one of the switching elements 2 upon determining that the obtained temperature of the at least one of the switching elements 2 is higher than the predetermined temperature threshold. This prevents an overcurrent from flowing through each switching element 2, thus protecting the corresponding switching element 2.

Note that, as illustrated in FIG. 9, the control circuit 3 includes the five control terminals 42 for each switching element 2 ($2_A$, $2_B$), and the five control terminals 42 are respectively connected to (1) The control terminal (gate electrode) $21_g$ of the corresponding switching element 2

(2) The reference electrode (emitter electrode) $21_e$ of the corresponding switching element 2

(3) The sense electrode $21_s$ of the corresponding switching element 2

(4) The anode electrode $21_a$ of the corresponding switching element 2

(5) The cathode electrode $21_k$ of the corresponding switching element 2

Next, the following describes how the power converter 1 operates, and also describes technical benefits obtained by the configuration of the power converter 1.

Referring to FIGS. 1 and 2, the power converter 1 is configured such that the feedback route FR connects between the control electrode $21_g$ of the first switching element $2_A$ and the control electrode $21_g$ of the second switching element $2_B$.

In particular, a resistance of the feedback route FR is set to a sufficiently small value, i.e. set to be lower than the value RA of the on-resistance $R_{on}$ of the drive switch $35a$; the on-resistance $R_{on}$ of the drive switch $35a$ takes the value RA when the gate voltage $V_{ge}$ of each switching element $2_A$, $2_B$ has been held to the Miller voltage $V_M$ within the Miller period $T_M$ (see FIG. 5).

This configuration of the feedback route FR enables currents for the respective switching elements 2 parallelly connected to each other during turning on or off the switching elements 2 to balance with each other.

That is, setting the resistance of the feedback route FR to a sufficiently small value enables the feedback current $I_{fb}$ to be likely to flow through the feedback route FR, resulting in currents, which flow through the respective switching elements 2 parallelly connected to each other, balancing with each other. This makes it possible to substantially uniform the amount of heat generated by each of the switching elements 2 parallelly connected to one another with the amount of heat generated by the other of the switching elements 2 during turning on or off the switching elements 2.

Next, the following describes another aspect of a technical benefit obtained by the power converter 1 as follows.

Figure 25:
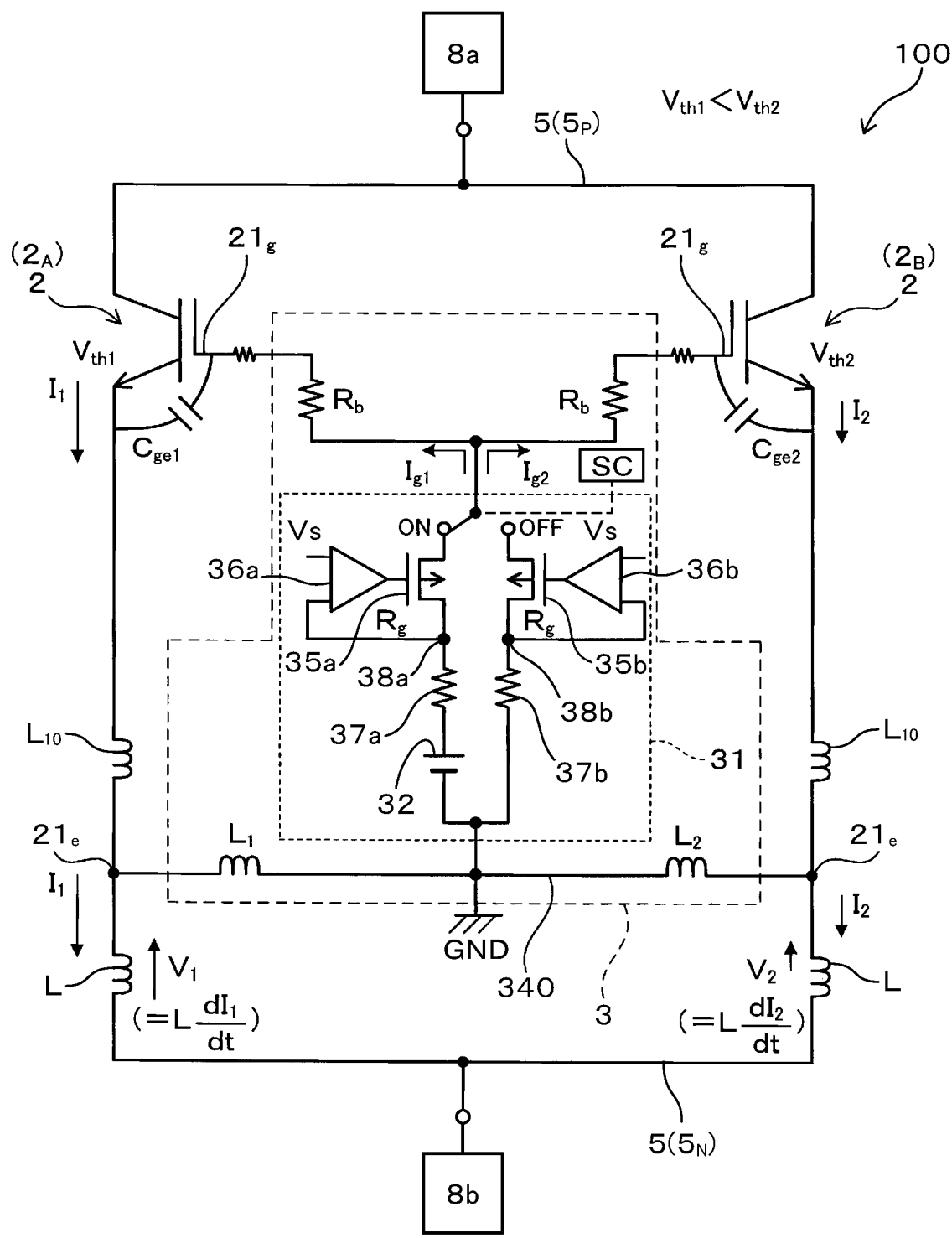

FIG. 25 schematically illustrates a power converter 100 according to a comparative example of the first embodiment. Specifically, the power converter 100 of the comparative example has a substantially identical configuration of the power converter 1 except that (1) No connection is established between the control electrode $21_g$ of the first switching element $2_A$ and the control electrode $21_g$ of the second switching element $2_B$ (2) A point P of the wiring 340 is connected to the common signal ground GND During turn-on or turn-off of the first and second switching elements $2_A$ and $2_B$ of the power converter 100, the difference of a control current $I_{g1}$ flowing through the first balance resistor $R_b1$ from a control current $I_{g2}$ flowing through the second balance resistor $R_b2$ can be expressed by, for example, the following equation (1):

$$I_{g2} - I_{g1} = \frac{\left\{(V_{ge1} - V_{ge2}) + L\left(\frac{dI_1}{dt} - \frac{dI_2}{dt}\right)\right\}}{V_{ge1} + V_{ge2}} \times \frac{V_{in}}{R_g} \quad (1)$$

The bottom of the fraction of the equation (1) includes the speed adjustment resistance $R_g$. For this reason, reducing the speed adjustment resistance $R_g$ enables the difference of the control current $I_{g1}$ flowing through the first balance resistor $R_b1$ from the control current $I_{g2}$ flowing through the second balance resistor $R_b2$ to become grater. This makes it possible to balance a first current flowing through or from the first switching element $2_A$ with a second current flowing through or from the second switching element $2_B$ even if the first current is considerably higher than the second current.

However, sufficiently reducing the speed adjustment resistance $R_g$ may cause the switching speed of each of the first and second switching elements $2_A$ and $2_B$ to be excessively high, resulting in a surge being likely to occur. This therefore may make it difficult for us to use the power converter 100 of the comparative example.

In contrast, the feedback route FR connecting between the control electrodes $21_g$ of the first and second switching elements $2_A$ and $2_B$ enables, during turn-on or turn-off of the first and second switching elements $2_A$ and $2_B$ of the power converter 1, the difference of the control current $I_{g1}$ from the control current $I_{g2}$ to be expressed by, for example, the following equation (2):

$$I_{g2} - I_{g1} = \frac{\left\{(V_{ge1} - V_{ge2}) + L\left(\frac{dI_1}{dt} - \frac{dI_2}{dt}\right)\right\}}{R_{fb}} \quad (2)$$

The bottom of the fraction of the equation (2) includes the resistance $R_{fb}$ of the feedback resistor $R_{fb}$. For this reason, reducing the resistance $R_{fb}$ of the feedback resistor $R_{fb}$, enables the difference of the control current $I_{g1}$ from the control current $I_{g2}$ to become grater. This makes it possible to balance the first current flowing through or from the first switching element $2_A$ with the second current flowing through or from the second switching element $2_B$ even if the first current is considerably higher than the second current.

In particular, because the resistance $R_{fb}$ of the feedback resistor $R_{fb}$ has little influence on the switching speed of each of the first and second switching elements $2_A$ and $2_B$, which is different from the speed adjustment resistance $R_g$, it is possible to sufficiently reduce the resistance $R_{fb}$ of the feedback resistor $R_{fb}$.

Figure 21:
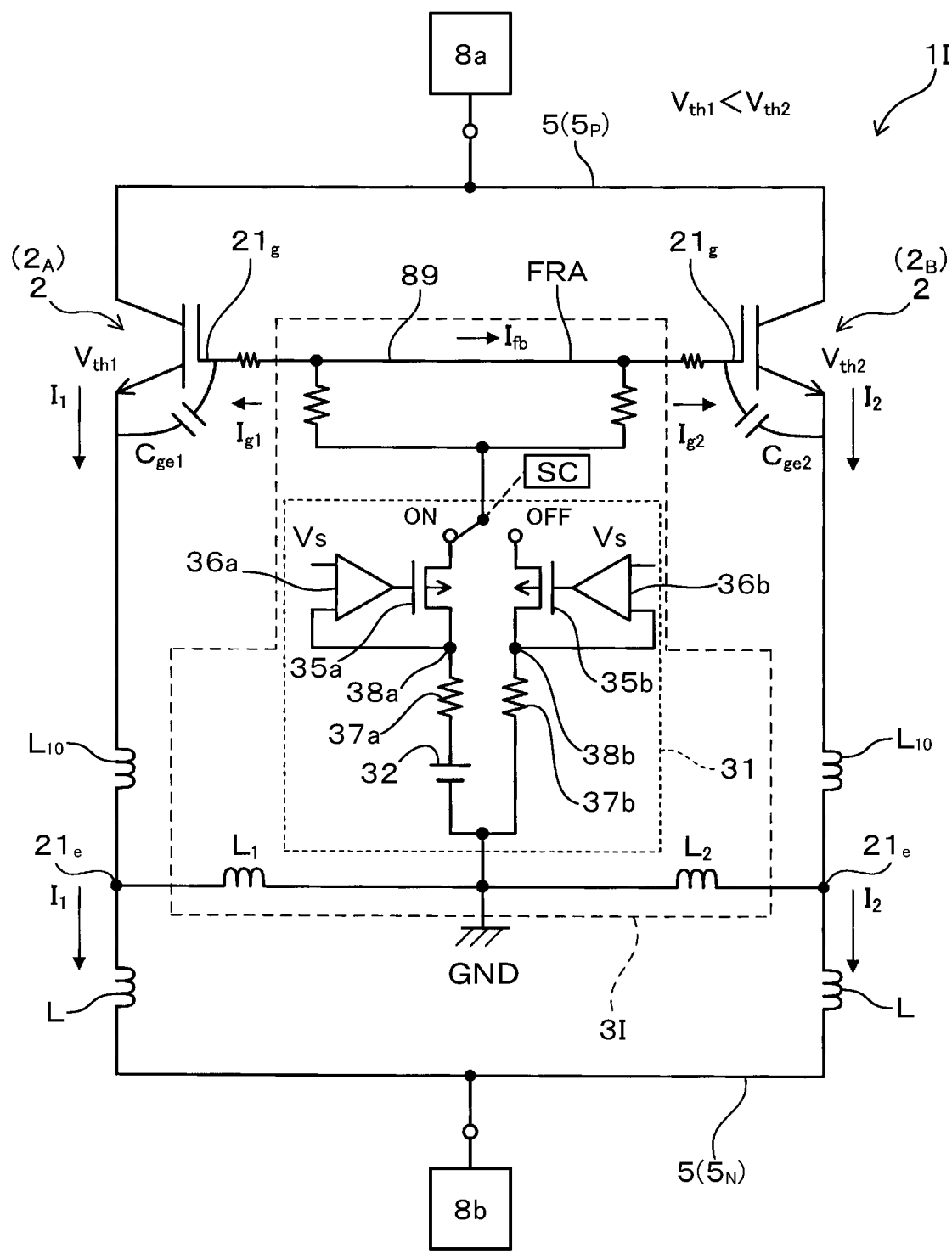
FIG. 21 is a circuit diagram schematically illustrating selected components of a power converter according to the tenth embodiment of the present disclosure.

As illustrated in FIG. 21 described later, a feedback route FRA, which is comprised of no feedback resistor $R_{fb}$, can connect between the control electrode $21_g$ of the first switching element $2_A$ and the control electrode $21_g$ of the second switching element $2_B$. This may cause each of the first switching element $2_A$ and the second switching element $2_B$ to be likely to slightly oscillate.

In contrast, the feedback route FR, which is comprised of the feedback resistor $R_{fb}$, connects between the control electrode $21_g$ of the first switching element $2_A$ and the control electrode $21_g$ of the second switching element $2_B$. This therefore make it possible to sufficiently prevent each of the first switching element $2_A$ and the second switching element $2_B$ from oscillating.

The power converter 1 of the first embodiment is configured such that each drive unit 31 provided for the corresponding first and second switching elements $2_A$ and $2_B$ parallelly connected to each other drives both the first and second switching elements $2_A$ and $2_B$.

The drive unit 31 of the first embodiment is configured to drive both the first and second switching elements $2_A$ and $2_B$ (see, for example, FIG. 1), resulting in a reduction in the manufacturing cost of the power converter 1.

The feedback resistor $R_{fb}$ can be mounted to one of the major surfaces 39 of the control circuit 3, resulting in an effective use of one of the major surfaces 39 of the control circuit 3. This also enables other electronic elements, such as coils, to be easily connected to the feedback resistor $R_{fb}$ mounted to one of the major surfaces 39 of the control circuit 3.

Additionally, as illustrated in FIG. 1, the feedback resistor $R_{fb}$ is connected to the control electrode $21_g$ of each of the first and second switching elements $2_A$ and $2_B$ via the feedback wiring 89. Each inter-electrode resistance $r_p$ exists between the corresponding one of the first and second parts of the feedback wiring 89 and the control terminal $21_g$ of the corresponding one of the first and second switching elements $2_A$ and $2_B$. The control circuit 3 includes the first and second balance resistors $R_b1$ and $R_b2$. The first and second balance resistors $R_b1$ and $R_b2$ are adjusted to reduce an imbalance between the control currents $I_{g1}$ and $I_{g2}$ flowing through the respective first and second balance resistors $R_b1$ and $R_b2$ due to an imbalance between the inter-electrode resistances $r_p$ of the respective first and second switching elements $2_A$ and $2_B$.

The above configuration of the power converter 1 enables the first and second balance resistors $R_b1$ and $R_b2$ to be likely to decrease the imbalance between the control currents $I_{g1}$ and $I_{g2}$ due to the imbalance between the inter-electrode resistances $r_p$. This enables adjustment of the resistance of the feedback resistor $R_{fb}$ to easily balance currents, which flow through the respective switching elements 2 parallelly connected to each other, with each other.

As described in detail above, the first embodiment provides the power converter 1, which is capable of balancing currents, which flow through the respective switching elements 2 parallelly connected to each other, during turning on or turning off of them, with each other.

The power converter 1 of the first embodiment can use other types of switching elements, such as MOSFETs as the respective switching elements 2.

The power converter 1 of the first embodiment can be configured such that each switch set can be comprised of three or more switching elements 2 connected in parallel to each other.

Second Embodiment

Figure 10:
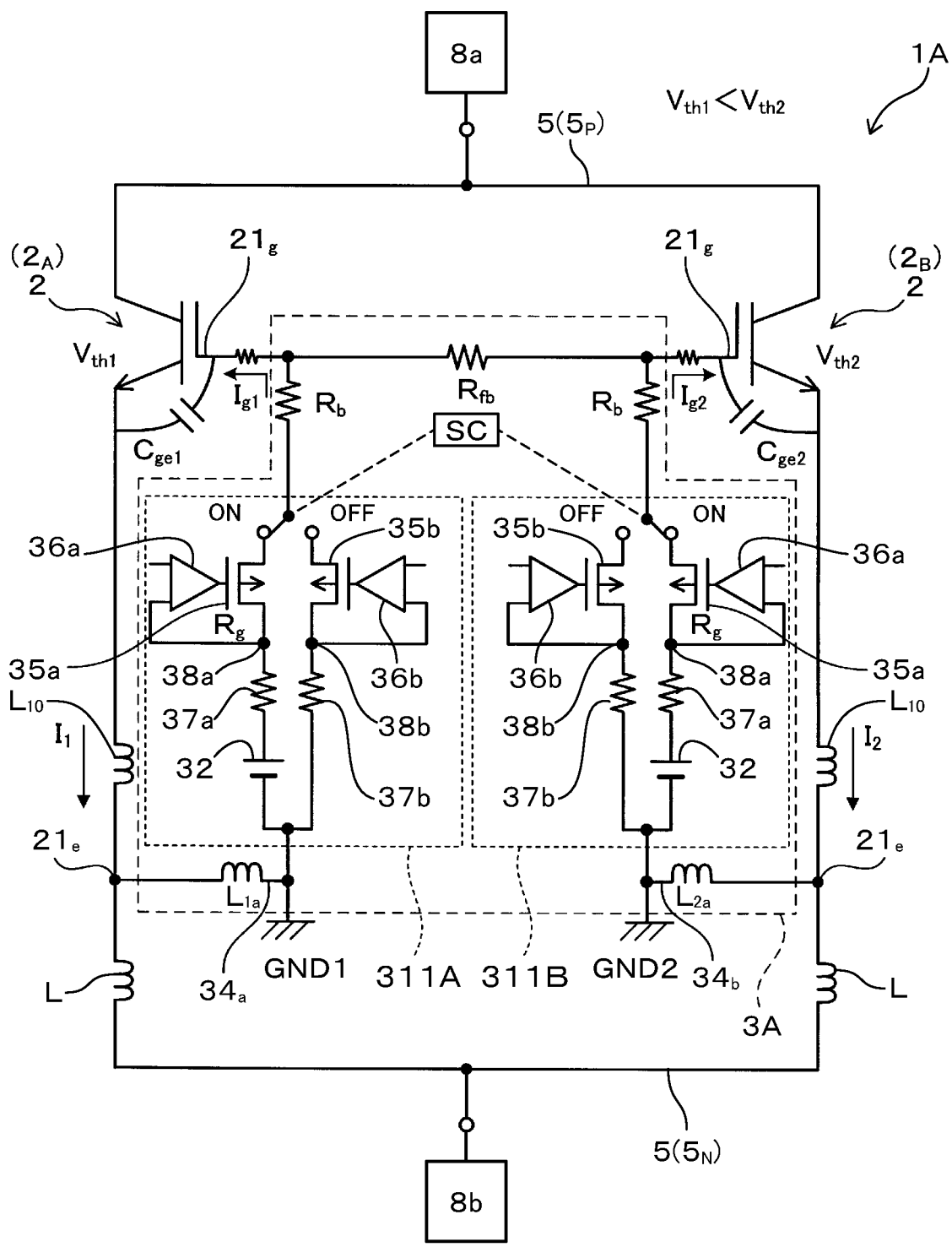
FIG. 10 is a circuit diagram schematically illustrating selected components of a power converter according to the second embodiment of the present disclosure.
Figure 11:
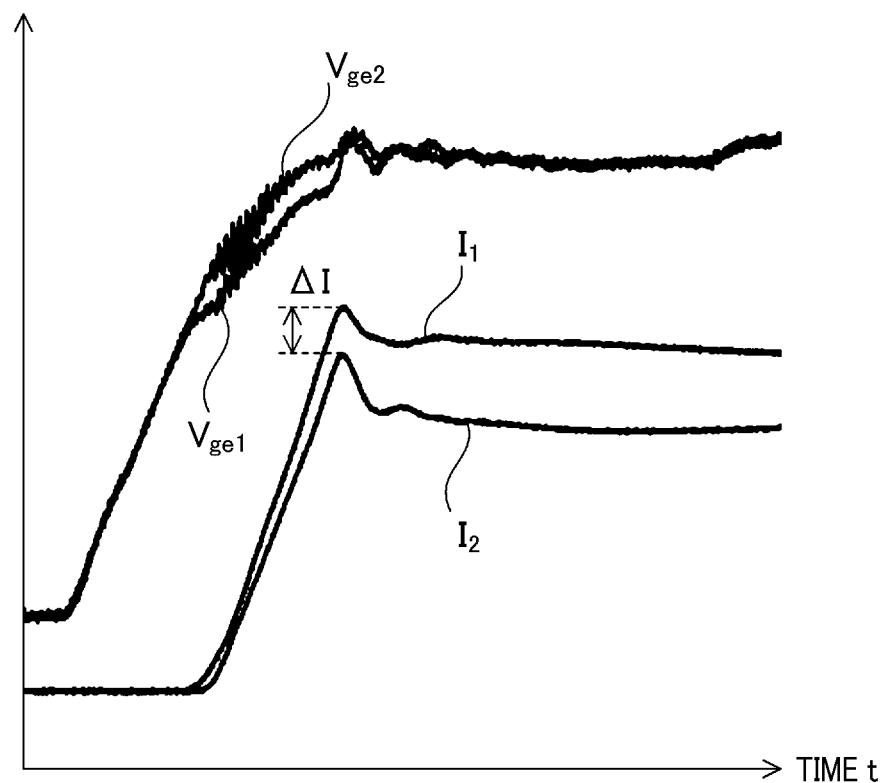
FIG. 11 is a graph schematically illustrating how each of on currents and gate voltages of the respective first and second switching elements is changed over time according to the first embodiment.
Figure 12:
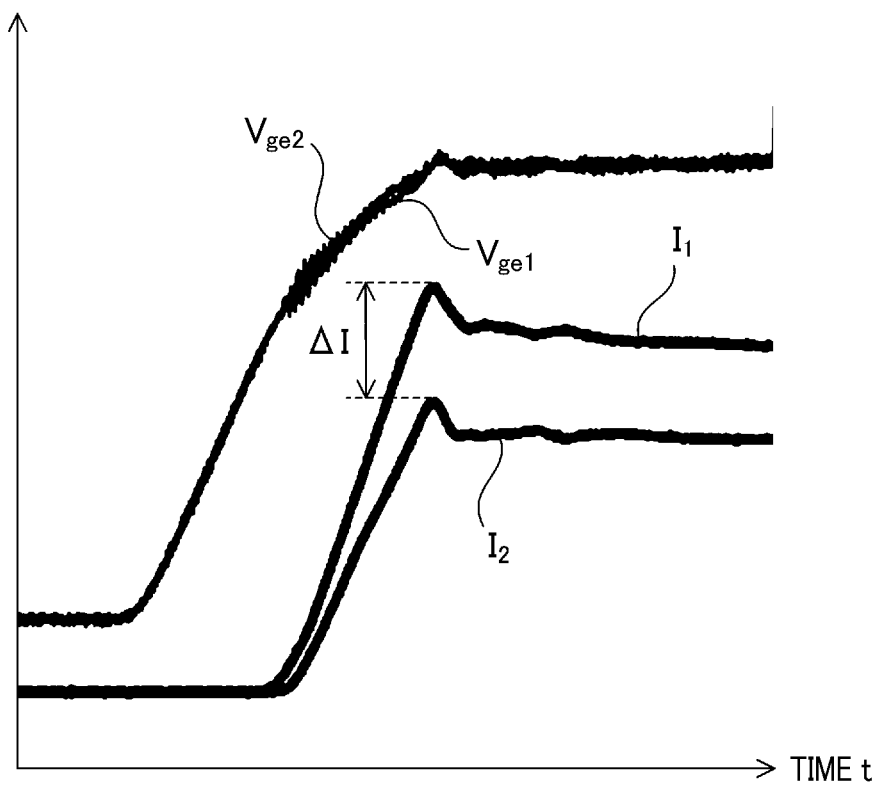
FIG. 12 is a graph schematically illustrating how each of the on currents and gate voltages of the respective first and second switching elements is changed over time according to a comparative example.

The following describes the second embodiment of the present disclosure with reference to FIGS. 10 to 12. FIG. 10 schematically illustrates selected components of a power converter 1A according to the second embodiment; the selected components illustrated in FIG. 10 substantially correspond to the respective selected components illustrated in, for example, FIG. 1.

The structures and/or functions of the power converter 1A according to the second embodiment are different from those of the power converter 1 according to the first embodiment in the following points. So, the following mainly describes the different points, and omits or simplifies descriptions of like parts between the first and second embodiments, to which identical or like reference characters are assigned, thus eliminating redundant description.

The circuit structure of a control circuit 3A of the power converter 1A is slightly different from the circuit structure of the control circuit 3. Specifically, the control circuit 3A includes a plurality of, i.e. twelve, drive units 311 provided for the respective switching elements 2, and the switch controller SC controllably connected to the respective drive units 311.

The drive units 311 include first drive units 311A provided for respectively driving the first switching elements $2_A$, and second drive units 311B provided for respectively driving the second switching elements $2_B$.

Specifically, each of the first and second drive units 311A and 311B is comprised of the first driver 31a, the second driver 31b, and the selection switch 33, which is similar to the drive unit 31 of the first embodiment. Like the drive unit 31, the first driver 31a includes the first balance resistor $R_b1$, the first drive switch 35a, the first operational amplifier 36a, the first shunt resistor 37a, and the drive power source 32, and the second driver 31b includes the second balance resistor $R_b2$, the second drive switch 35b, the second operational amplifier 36b, and the second shunt resistor 37b.

That is, the first drive unit 311A can be configured to turn on or off the first switching element $2_A$ independently of the second switching element $2_B$, and the second drive unit 311B can be configured to turn on or off the second switching element $2_B$ independently of the first switching element $2_A$.

This configuration enables the switching controller SC to instruct both the first and second drive units 311A and 311B to cause the respective first and second switching elements 2 ($2_A$, $2_B$) to output the respective on currents $I_1$ and $I_2$ for responding to a request to obtain a large level of the total output current of the power converter 1A. In contrast, this configuration enables the switching controller SC to instruct one of the first and second drive units 311A and 311B to cause a corresponding one of the first and second switching elements 2 ($2_A$, $2_B$) to output a corresponding one of the on currents $I_1$ and $I_2$ if there is no request to obtain a large level of the total output current of the power converter 1A.

Additionally, the negative terminal of the drive power source 32 and the second end of the second shunt resistor 37b of the first drive unit 311A are connected to a predetermined first common signal ground GND1 of the control circuit 3 via a first wiring 34a. The first reference line $21_eL1$ connecting between the reference electrode $21_e$ of the first switching element $2_A$ and the negative busbar $5_N$ is connected to the first common signal ground GND1.

Similarly, the negative terminal of the drive power source 32 and the second end of the second shunt resistor 37b of the second drive unit 311B are connected to a predetermined second common signal ground GND2 of the control circuit 3 via a second wiring 34b. The second reference line $21_eL2$ connecting between the reference electrode $21_e$ of the second switching element $2_B$ and the negative busbar $5_N$ is connected to the second common signal ground GND2.

The first wiring 34a has a first parasitic inductance L1α between the first reference line $21_eL1$ and the first common signal ground GND1, and the second wiring 34b has a second parasitic inductance L2α between the second reference line $21_eL2$ and the second common signal ground GND2.

That is, the first common signal ground GND1 serves as a signal common ground of the first switching element $2_A$ and the first drive unit 311A, and the second common signal ground GND2 serves as a signal common ground of the second switching element $2_B$ and the second drive unit 311B. The first common signal ground GND1 and the second common signal ground GND2 are electrically isolated from each other.

Figure 26:
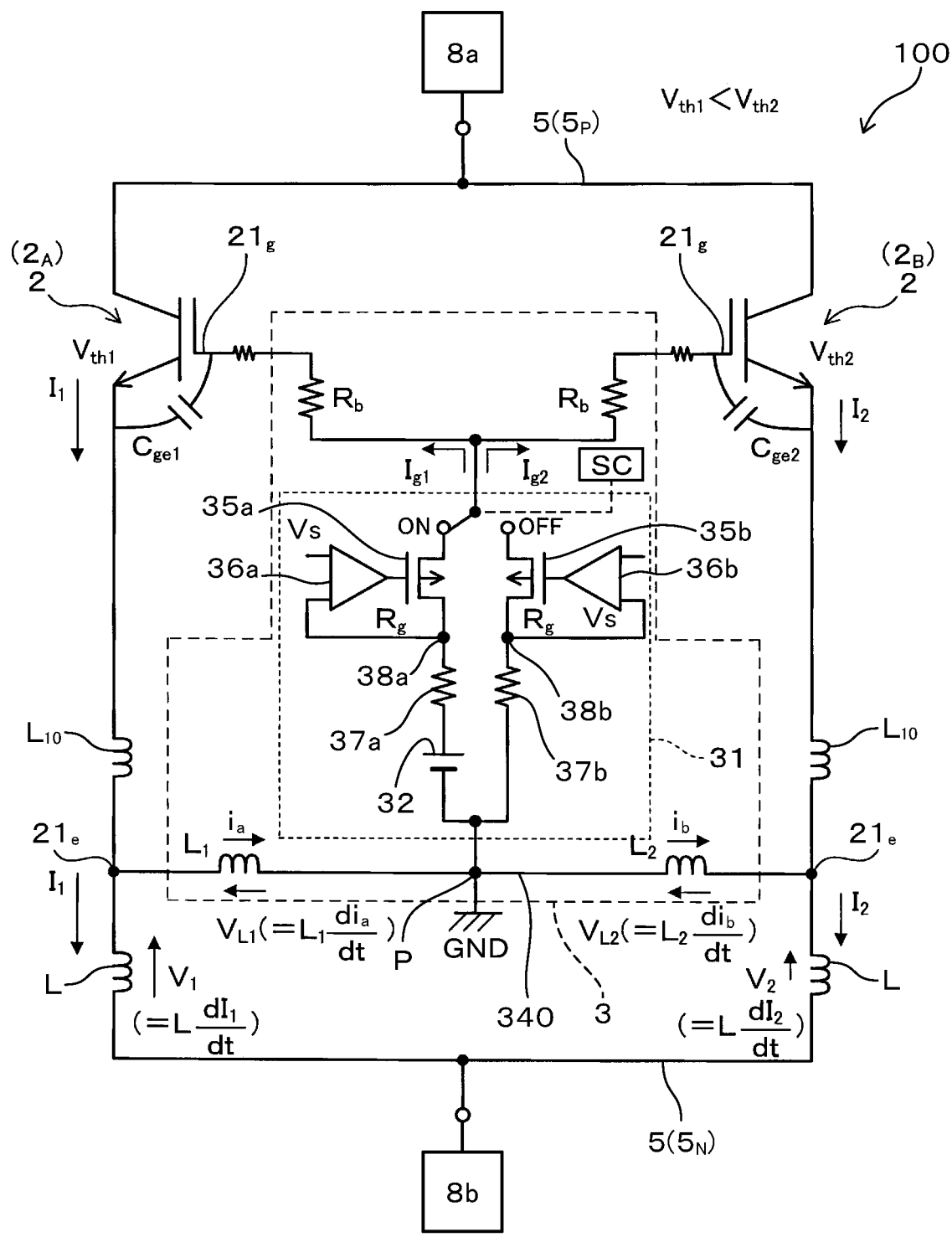
FIG. 26 is a circuit diagram schematically illustrating the selected components of the power converter according to the comparative example of the first embodiment.

In contrast, FIG. 26 schematically illustrates the power converter 100 according to the comparative example of each of the first and second embodiments.

The wiring 34 has the parasitic inductance L1 between the reference electrode $21_e$ and the point P, and a parasitic inductance L2 between the reference electrode $21_e$ and the point P.

As illustrated in FIG. 26, the power converter 100A may cause (1) A part of the on current $I_1$ to flow through the wiring 34 from the reference electrode $21_e$ to the point P as a branched current ia (2) A part of the on current $I_2$ to flow through the wiring 34 from the reference electrode $21_e$ to the point P as a branched current ib This may cause a voltage $V_{L1}$, which is expressed by $L1_{dia}/dt$, to be induced across the parasitic inductance L1, and also may cause a voltage V2, which is expressed by $L2_{dib}/dt$, to be induced across the parasitic inductance L2 (see FIG. 26).

The variations in each of the parasitic inductances L1 and L2 may cause variations in a corresponding one of the voltage $V_{L1}$ induced across the parasitic inductance L1 and the voltage V2 induced across the parasitic inductance L2 due to the variations in the corresponding one of the parasitic inductances L1 and L2. This may cause a larger control current $I_{g1}$ to flow through the first switching element $2_A$ having the lower threshold voltage $V_{th1}$ as compared with a control current $I_{g2}$ flowing through the second switching element $2_B$ having the higher threshold voltage $V_{th2}$. This may result in an increase in the imbalance between the control currents $I_{g1}$ and $I_{g2}$ for the respective first and second switching elements $2_A$ and $2_B$.

In contrast, the power converter 1A is configured such that the first common signal ground GND1 serving as the signal common ground of the first switching element $2_A$ and the first drive unit 311A and the second common signal ground GND2 serving as the signal common ground of the second switching element $2_B$ and the second drive unit 311B are electrically isolated from each other.

This configuration prevents any current from flowing between the first point P1($21_e$) connected to the reference electrode $21_e$ of the first switching element $2_A$ and the second point P2($21_e$) connected to the reference electrode $21_e$ of the second switching element $2_B$. This therefore prevents an increase in the imbalance between the control currents $I_{g1}$ and $I_{g2}$ for the respective first and second switching elements $2_A$ and $2_B$.

The creators of the present disclosure performed experiments for demonstrating how the power converter 1A works to thereby obtain technical benefits with FIGS. 11 and 12. First, the creators produced the circuit of the power converter 1A illustrated in FIG. 10. In the produced circuit, a value of the speed adjustment resistance $R_g$ during the Miller period $T_M$ of each switching element $2_A$, $2_B$, i.e. the on resistance $R_{on}$ of the corresponding one of the drive switches 35a and 35b, is adjusted to be set to 3.6Ω, and the total resistance between the control electrodes $21_g$ of the first and second switching elements $2_A$ and $2_B$ via the feedback route FR is set to 1 Ω.

Then, the creators turned on the first and second switching elements $2_A$ and $2_B$ simultaneously, and measured the on currents $I_1$ and $I_2$, and also measured the gate voltages, $V_{ge1}$ and $V_{ge2}$ of the respective first and second switching elements $2_A$ and $2_B$.

FIG. 11 schematically illustrates how each of the measured parameters $I_1$, $I_2$, $V_{ge1}$, and $V_{ge2}$ is changed over time t according to the second embodiment.

On the other hand, the creators produced the circuit of the power converter 100 illustrated in each of FIGS. 25 and 26. In the produced circuit, a value of the speed adjustment resistance $R_g$ during the Miller period $T_M$ of each switching element $2_A$, $2_B$, i.e. the on resistance $R_{on}$ of the corresponding one of the drive switches 35a and 35b, is adjusted to be set to 7.2Ω, and no connection is established between the control electrodes $21_g$ of the first and second switching elements $2_A$ and $2_B$.

Then, the creators turned on the first and second switching elements $2_A$ and $2_B$ simultaneously, and measured the on currents $I_1$ and $I_2$, and also measured the gate voltages $V_{ge1}$ and $V_{ge2}$ of the respective first and second switching elements $2_A$ and $2_B$.

FIG. 12 schematically illustrates how each of the measured parameters $I_1$, $I_2$, $V_{ge1}$, and $V_{ge2}$ is changed over time t according to the comparative example.

As clearly seen by comparison between the graph of FIG. 11 and the graph of FIG. 12, the absolute difference ΔI between the on currents $I_1$ and $I_2$ according to the first embodiment (see FIG. 11) is smaller than the absolute difference ΔI between the on currents $I_1$ and $I_2$ according to the comparative example (see FIG. 12).

This therefore enables the difference between the on currents $I_1$ and $I_2$ to be smaller, resulting in the power converter 1A of the second embodiment obtaining the same technical benefits as those obtained by the power converter 1 of the first embodiment.

Third Embodiment

Figure 13:
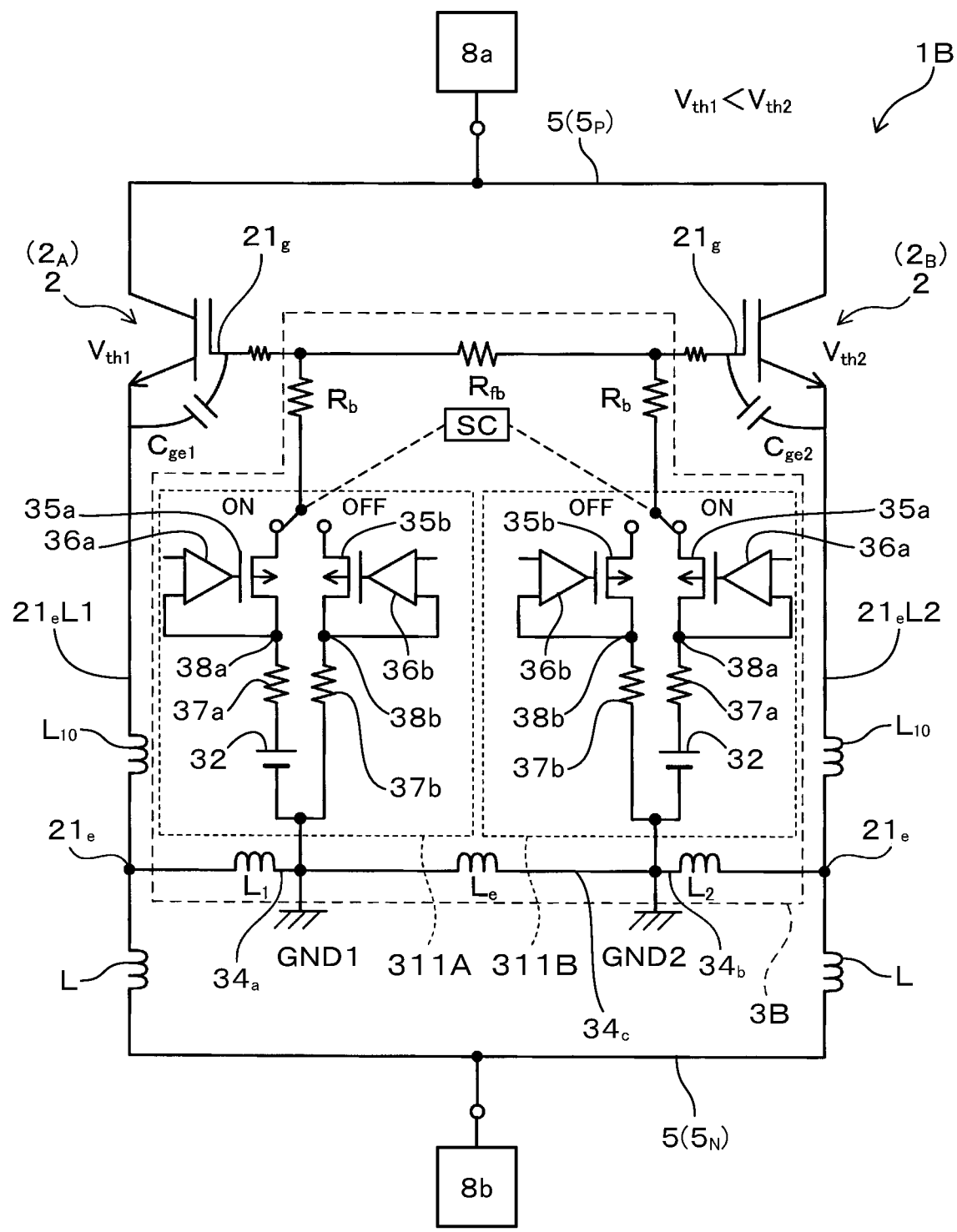
FIG. 13 is a circuit diagram schematically illustrating selected components of a power converter according to the third embodiment of the present disclosure.

The following describes the third embodiment of the present disclosure with reference to FIG. 13. FIG. 13 schematically illustrates selected components of a power converter 1B according to the third embodiment; the selected components illustrated in FIG. 13 substantially correspond to the respective selected components illustrated in FIG. 10.

The structures and/or functions of the power converter 1B according to the third embodiment are different from those of the power converter 1A according to the second embodiment in the following points. So, the following mainly describes the different points, and omits or simplifies descriptions of like parts between the second and third embodiments, to which identical or like reference characters are assigned, thus eliminating redundant description.

Like the control circuit 3A of the power converter 1A, a control circuit 3B of the power converter 1B includes the plurality of, i.e. twelve, drive units 311 provided for the respective switching elements 2, and the switch controller SC controllably connected to the respective drive units 311.

The drive units 311 include the first drive units 311A provided for respectively driving the first switching elements $2_A$, and the second drive units 311B provided for respectively driving the second switching elements $2_B$.

That is, the first drive unit 311A can be configured to turn on or off the first switching element $2_A$ independently of the second switching element $2_B$, and the second drive unit 311B can be configured to turn on or off the second switching element $2_B$ independently of the first switching element $2_A$.

In particular, the control circuit 3B includes an intermediate wiring 34c connecting between the first wiring 34a and the second wiring 34b, and a reference coil $L_e$ mounted to the intermediate wiring 34c. That is, the reference coil $L_e$ is arranged between the reference electrodes $21_e$ of the first and second switching elements $2_A$ and $2_B$.

The following describes how the power converter 1B works to thereby obtain technical benefits.

The reference coil $L_e$ arranged on the connection line between the reference electrodes $21_e$ of the first and second switching elements $2_A$ and $2_B$ enables an impedance of the connection line between the reference electrodes $21_e$ of the first and second switching elements $2_A$ and $2_B$ to be higher as compared with the power converter 100 whose connection line between the reference electrodes $21_e$ of the first and second switching elements $2_A$ and $2_B$ has no coils. This therefore results in both the branched current ia, which is a part of the on current $I_1$, and the branched current ib, which is a part of the on current $I_2$, being difficult to flow through the connection line.

As described above, the variations in each of the parasitic inductances L1 and L2 may cause variations in a corresponding one of the voltage $V_{L1}$ induced across the parasitic inductance L1 and the voltage V2 induced across the parasitic inductance L2 due to the variations in the corresponding one of the parasitic inductances L1 and L2. This may cause a larger control current $I_{g1}$ to flow through the first switching element $2_A$ having the lower threshold voltage $V_{th1}$ as compared with a control current $I_{g2}$ flowing through the second switching element $2_B$ having the higher threshold voltage $V_{th2}$. This may result in an increase in the imbalance between the control currents $I_{g1}$ and $I_{g2}$ for the respective first and second switching elements $2_A$ and $2_B$.

In contrast, the power converter 1B is configured such that the reference coil $L_e$ arranged on the connection line between the reference electrodes $21_e$ of the first and second switching elements $2_A$ and $2_B$ enables the impedance of the connection line between the reference electrodes $21_e$ of the first and second switching elements $2_A$ and $2_B$ to be higher as compared with the power converter 100 whose connection line between the reference electrodes $21_e$ of the first and second switching elements $2_A$ and $2_B$ has no coils. This therefore prevents both the branched current ia, which is a part of the on current $I_1$, and the branched current ib, which is a part of the on current $I_2$, from flowing through the connection line.

This therefore enables the difference between the on currents $I_1$ and $I_2$ to be smaller, resulting in the power converter 1B of the third embodiment obtaining the same technical benefits as those obtained by the power converter 1 of the first embodiment.

Fourth Embodiment

Figure 14:
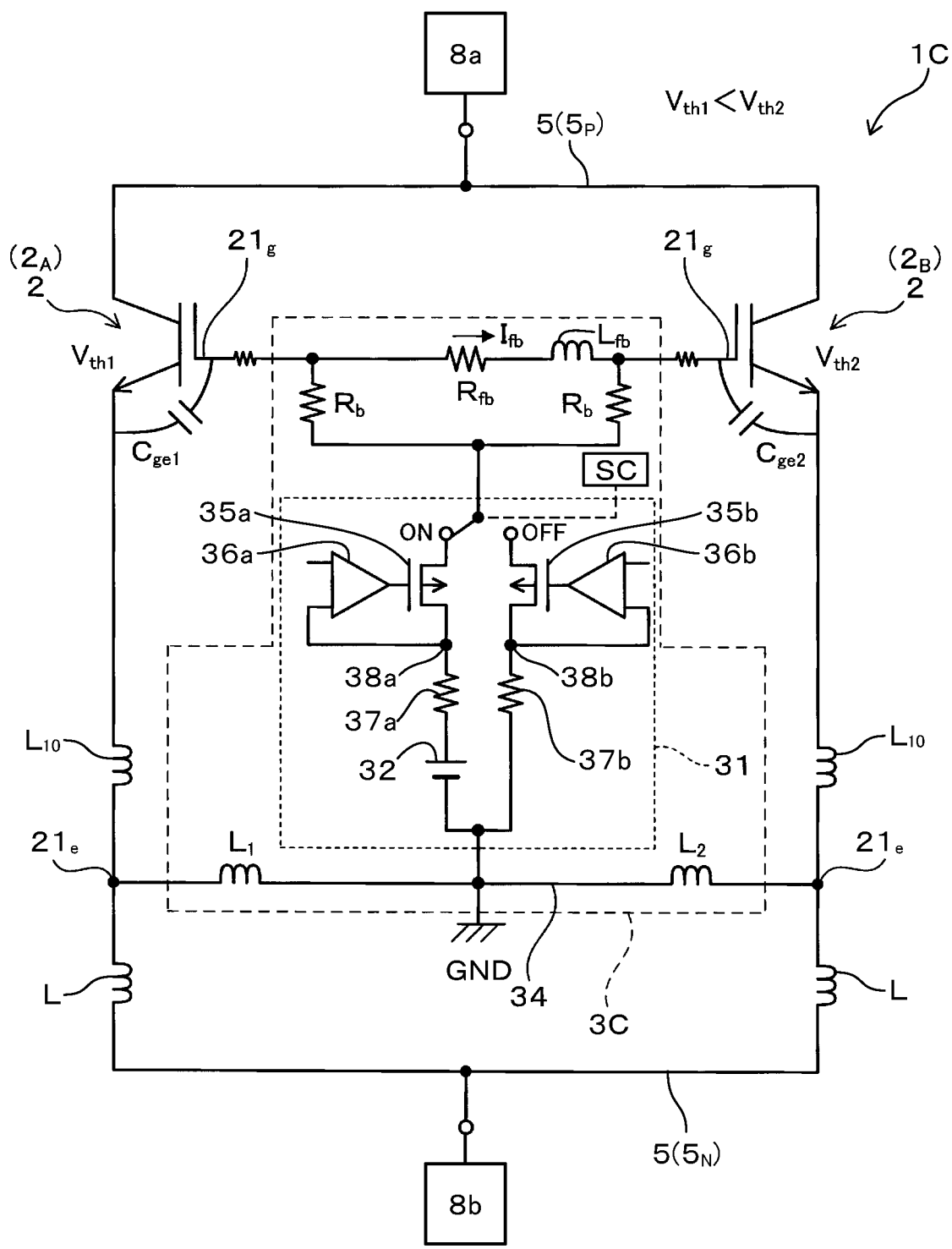
FIG. 14 is a circuit diagram schematically illustrating selected components of a power converter according to the fourth embodiment of the present disclosure.

The following describes the fourth embodiment of the present disclosure with reference to FIG. 14. FIG. 14 schematically illustrates selected components of a power converter 1C according to the fourth embodiment; the selected components illustrated in FIG. 14 substantially correspond to the respective selected components illustrated in, for example, FIG. 1.

The structures and/or functions of the power converter 1C according to the fourth embodiment are different from those of the power converter 1 according to the first embodiment in the following points. So, the following mainly describes the different points, and omits or simplifies descriptions of like parts between the first and fourth embodiments, to which identical or like reference characters are assigned, thus eliminating redundant description.

The circuit structure of a control circuit 3C of the power converter 1C is slightly different from the circuit structure of the control circuit 3. Specifically, the control circuit 3C includes a feedback coil $L_{fb}$ connected to the feedback resistor $R_{fb}$ in series.

This configuration eliminates high-frequency current components contained in the feedback current $I_{fb}$ from the feedback current $I_{fb}$.

Additionally, the power converter 1C also obtains the same technical benefits as those obtained by the power converter 1 of the first embodiment.

Fifth Embodiment

Figure 15:
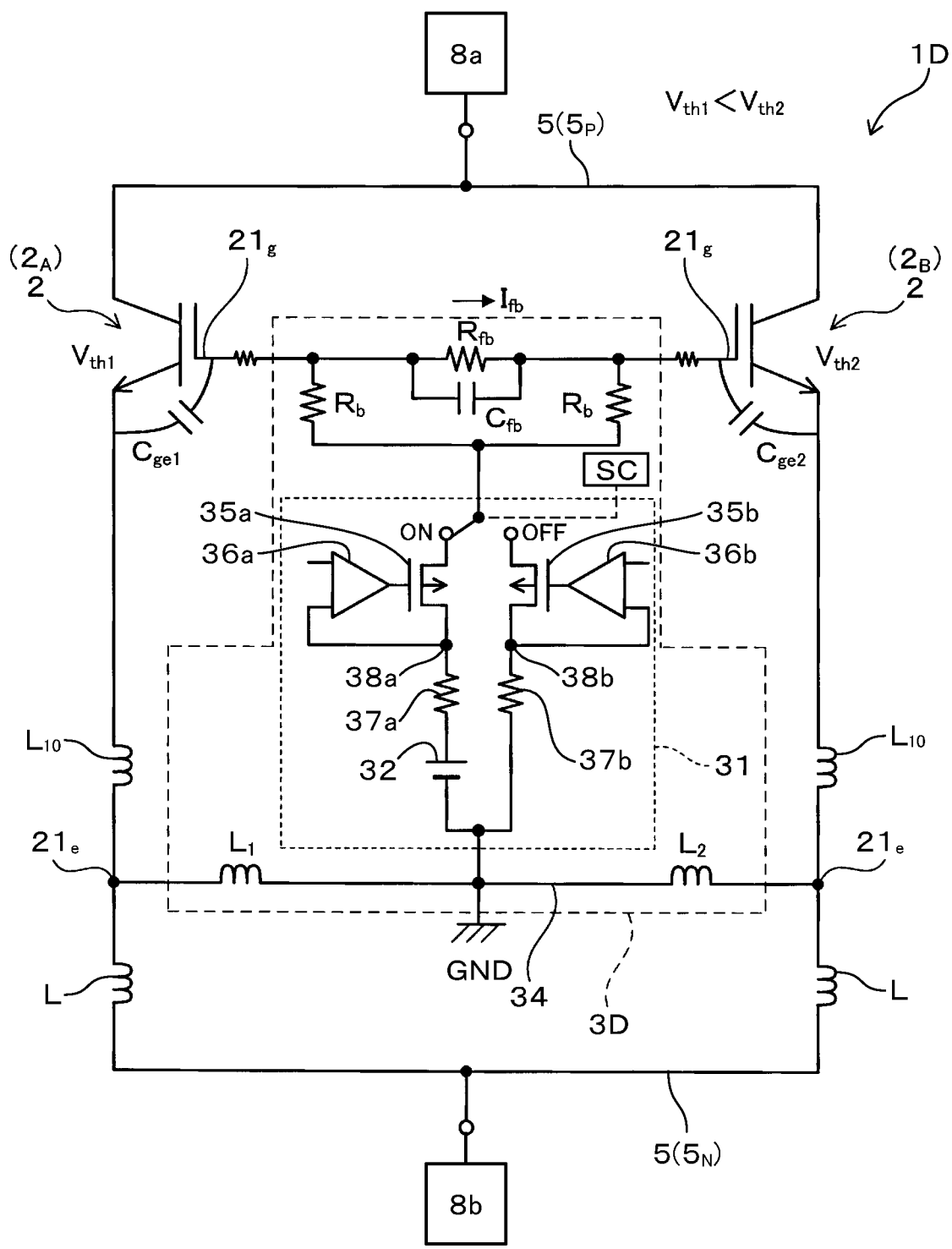
FIG. 15 is a circuit diagram schematically illustrating selected components of a power converter according to the fifth embodiment of the present disclosure.

The following describes the fifth embodiment of the present disclosure with reference to FIG. 15. FIG. 15 schematically illustrates selected components of a power converter 1D according to the fifth embodiment; the selected components illustrated in FIG. 15 substantially correspond to the respective selected components illustrated in, for example, FIG. 1.

The structures and/or functions of the power converter 1D according to the fifth embodiment are different from those of the power converter 1 according to the first embodiment in the following points. So, the following mainly describes the different points, and omits or simplifies descriptions of like parts between the first and fifth embodiments, to which identical or like reference characters are assigned, thus eliminating redundant description.

The circuit structure of a control circuit 3D of the power converter 1D is slightly different from the circuit structure of the control circuit 3. Specifically, the control circuit 3D includes a feedback capacitor $C_{fb}$ connected in parallel to the feedback resistor $R_{fb}$ in the feedback wiring 89. That is, the feedback capacitor $C_{fb}$ has opposing first and second electrodes, the first electrode and the first end of the feedback resistor $R_{fb}$ are commonly connected to the control electrode $21_g$ of the first switching element $2_A$, and the second electrode and the second end of the feedback resistor $R_{fb}$ are commonly connected to the control electrode $21_g$ of the second switching element $2_B$.

This configuration provides a damper effect that damps high-frequency current components in the feedback current $I_{fb}$ with a predetermined time constant based on the resistance of the feedback resistor $R_{fb}$ and the capacitance of the feedback capacitor C). This eliminates the high-frequency current components from the feedback current $I_{fb}$.

Additionally, the power converter 1D also obtains the same technical benefits as those obtained by the power converter 1 of the first embodiment.

Sixth Embodiment

Figure 16:
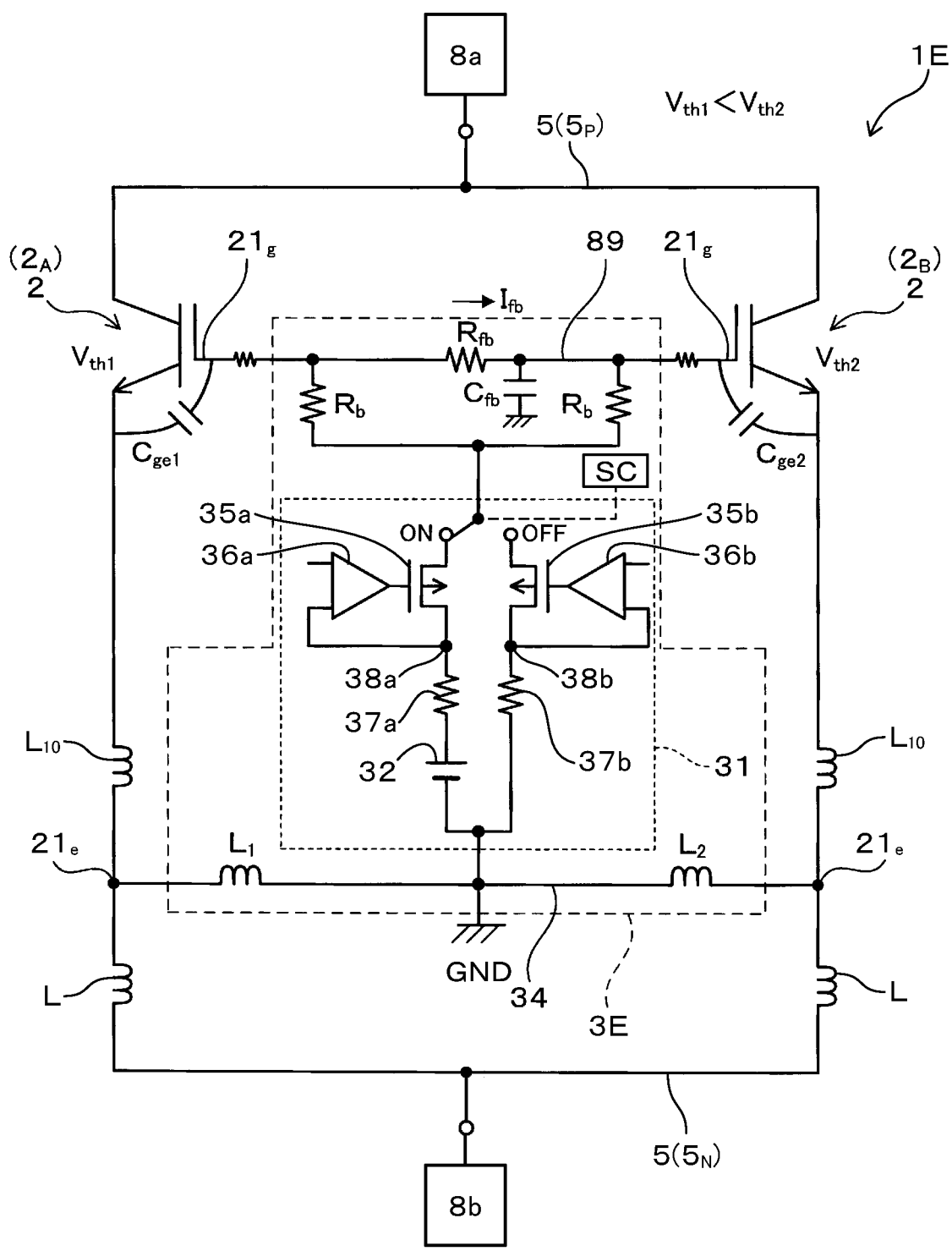
FIG. 16 is a circuit diagram schematically illustrating selected components of a power converter according to the sixth embodiment of the present disclosure.

The following describes the sixth embodiment of the present disclosure with reference to FIG. 16. FIG. 16 schematically illustrates selected components of a power converter 1E according to the sixth embodiment; the selected components illustrated in FIG. 16 substantially correspond to the respective selected components illustrated in, for example, FIG. 15.

The structures and/or functions of the power converter 1E according to the sixth embodiment are different from those of the power converter 1D according to the fifth embodiment in the following points. So, the following mainly describes the different points, and omits or simplifies descriptions of like parts between the fifth and sixth embodiments, to which identical or like reference characters are assigned, thus eliminating redundant description.

How the feedback capacitor $C_{fb}$) is connected to the feedback wiring 89 in a control circuit 3E of the power converter 1E is different from how the feedback capacitor $C_{fb}$ is connected to the feedback wiring 89 in the control circuit 3D.

Specifically, the first electrode of the feedback capacitor $C_{fb}$ is connected to, for example, the second part of the feedback wiring 89, and the second electrode thereof is connected to the common signal ground GND of the control circuit 3E.

This configuration enables high-frequency current components contained in the feedback current $I_{fb}$ to pass through the feedback capacitor $C_{fb}$ so as to flow to the common signal ground GND.

Additionally, the power converter 1E obtains the same technical benefits as those obtained by the power converter 1 of the first embodiment.

Seventh Embodiment

Figure 17:
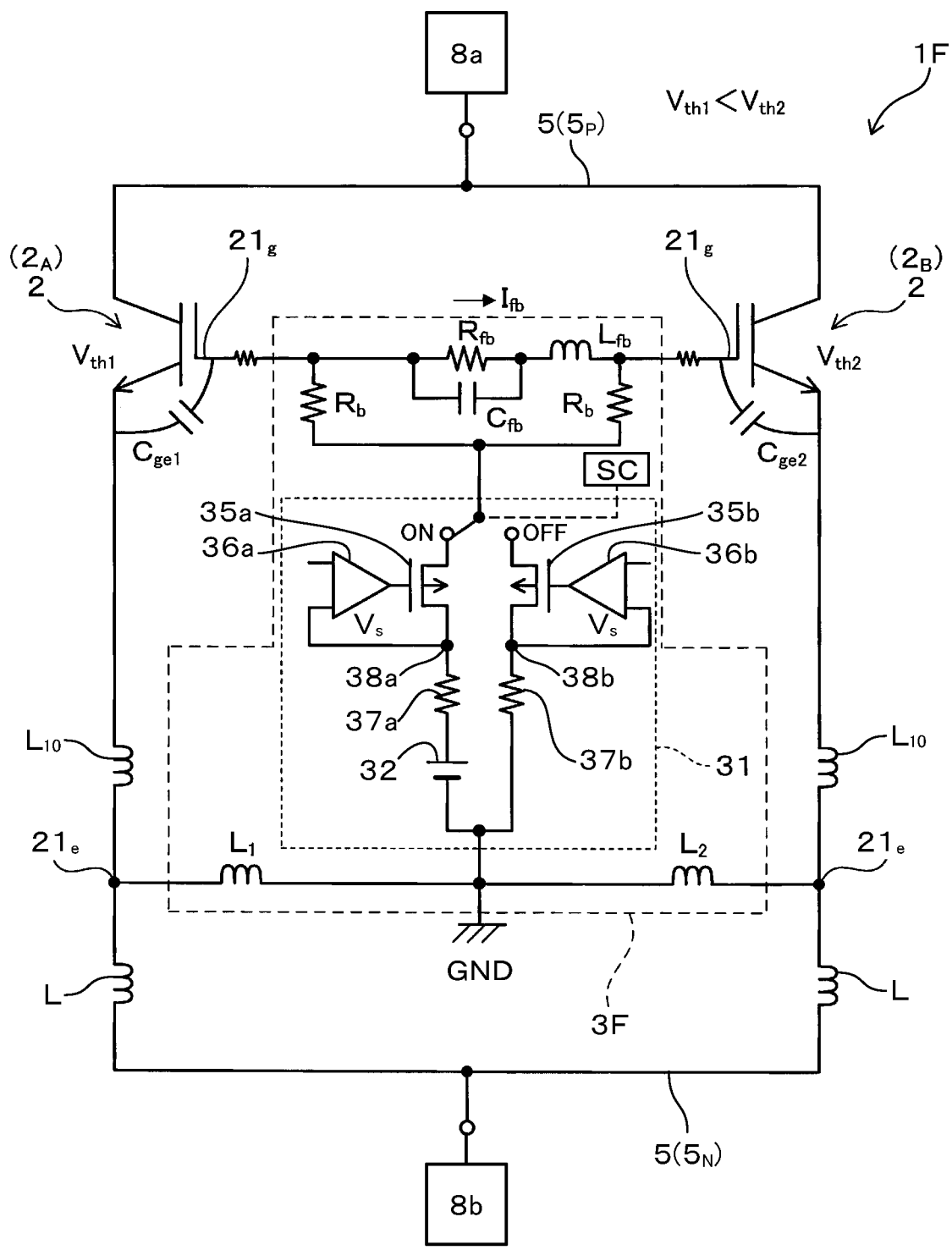
FIG. 17 is a circuit diagram schematically illustrating selected components of a power converter according to the seventh embodiment of the present disclosure.

The following describes the seventh embodiment of the present disclosure with reference to FIG. 17. FIG. 17 schematically illustrates selected components of a power converter 1F according to the seventh embodiment; the selected components illustrated in FIG. 17 substantially correspond to the respective selected components illustrated in, for example, FIG. 15.

The structures and/or functions of the power converter 1F according to the seventh embodiment are different from those of the power converter 1D according to the fifth embodiment in the following points. So, the following mainly describes the different points, and omits or simplifies descriptions of like parts between the fifth and seventh embodiments, to which identical or like reference characters are assigned, thus eliminating redundant description.

The circuit structure of a control circuit 3F of the power converter 1F is slightly different from the circuit structure of the control circuit 3D. Specifically, the control circuit 3F includes a feedback coil $L_{fb}$ connected to the feedback resistor $R_{fb}$ in series in addition to the feedback capacitor $C_{fb}$ connected in parallel to the feedback resistor $R_{fb}$ in the feedback wiring 89.

This configuration enables the combination of the feedback coil $L_{fb}$ and the feedback capacitor $C_{fb}$ to eliminate high-frequency current components contained in the feedback current $I_{fb}$ more efficiently eliminated from the feedback current $I_{fb}$.

Additionally, the power converter 1F also obtains the same technical benefits as those obtained by the power converter 1 of the first embodiment.

Eighth Embodiment

Figure 18:
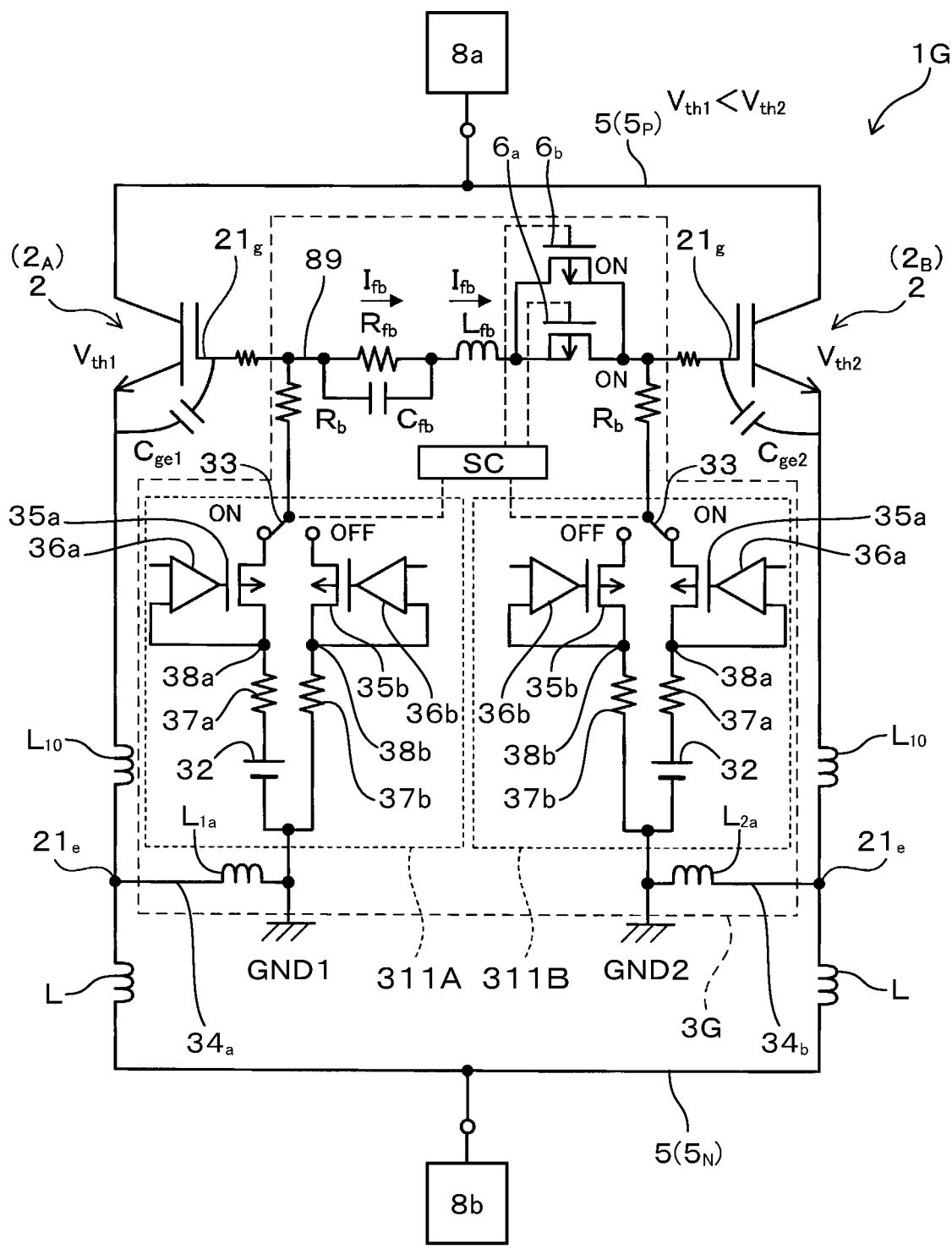

The following describes the eighth embodiment of the present disclosure with reference to FIG. 18. FIG. 18 schematically illustrates selected components of a power converter 1G according to the eighth embodiment; the selected components illustrated in FIG. 18 substantially correspond to the respective selected components illustrated in FIG. 10.

The structures and/or functions of the power converter 1G according to the eighth embodiment are different from those of the power converter 1 according to the second embodiment in the following points. So, the following mainly describes the different points, and omits or simplifies descriptions of like parts between the second and eighth embodiments, to which identical or like reference characters are assigned, thus eliminating redundant description.

Like the control circuit 3A of the power converter 1A, a control circuit 3G of the power converter 1G includes the plurality of, i.e. twelve, drive units 311 provided for the respective switching elements 2, and the switch controller SC controllably connected to the respective drive units 311.

The drive units 311 include the first drive units 311A provided for respectively driving the first switching elements $2_A$, and the second drive units 311B provided for respectively driving the second switching elements $2_B$.

That is, the first drive unit 311A can be configured to turn on or off the first switching element $2_A$ independently of the second switching element $2_B$, and the second drive unit 311B can be configured to turn on or off the second switching element $2_B$ independently of the first switching element $2_A$.

In addition, the negative terminal of the drive power source 32 and the second end of the second shunt resistor 37b of the first drive unit 311A are connected to the first common signal ground GND1 of the control circuit 3 via the first wiring 34a. The first reference line $21_eL1$ connecting between the reference electrode $21_e$ of the first switching element $2_A$ and the negative busbar $5_N$ is connected to the first common signal ground GND1.

Similarly, the negative terminal of the drive power source 32 and the second end of the second shunt resistor 37b of the second drive unit 311B are connected to the second common signal ground GND2 of the control circuit 3 via the second wiring 34b. The second reference line $21_eL2$ connecting between the reference electrode $21_e$ of the second switching element $2_B$ and the negative busbar $5_N$ is connected to the second common signal ground GND2.

In addition, the control circuit 3F includes a feedback coil $L_{fb}$ connected to the feedback resistor $R_{fb}$ in series in addition to the feedback capacitor $C_{fb}$ connected in parallel to the feedback resistor $R_{fb}$ in the feedback wiring 89.

In particular, the control circuit 3G includes first and second open-close members, i.e. first and second switches, such as MOSFETs, 6a and 6b mounted to the feedback wiring 89.

Specifically, each of the first and second switches 6a and 6b has an input terminal, i.e. its drain, an output terminal, i.e. its source, and a control terminal, i.e. its gate. Each of the first and second switches 6a and 6b has a conduction direction from the input terminal to the output terminal, and the first and second switches 6a and 6b are mounted to the feedback wiring 89. One of the first and second switches 6a and 6b, i.e. the first switch 6a, is connected in series to the feedback resistor $R_{fb}$ and the feedback coil $L_{fb}$, and the other of the first and second switches 6a and 6b, i.e. the second switch 6b, is connected in parallel to the one of the first and second switches 6a and 6b.

The conduction direction of the first switch 6a and the conduction direction of the second switch 6b are configured to be opposite to each other. Specifically, the first switch 6a is connected in series to the feedback resistor $R_{fb}$ and the feedback coil $L_{fb}$ such that its conduction direction is directed from the second switching element $2_B$ to the first switching element $2_A$, and the second switch 6b is connected in parallel to the first switch 6a such that its conduction direction is directed from the first switching element $2_A$ to the second switching element $2_B$.

The control terminal, i.e. the gate, of each of the first and second switches 6a and 6b is connected to the switch controller SC.

Referring to FIG. 18, for increasing the level of the total output current of the power converter 1G, the switch controller SC causes (1) The selection switch 33 of each of the first and second drive units 311A and 311B to select the first contact ON, thus turning on both the first and second switching elements 2 ($2_A$, $2_B$)

(2) Each of the first and second switches 6a and 6b to be turned on

This causes the feedback current $I_{fb}$ to flow through the feedback resistor $R_{fb}$, the feedback coil $L_{fb}$, and any one of the first and second switches 6a and 6b This configuration therefore results in an increase in the level of the total output current of the power converter 1G while reducing the imbalance between the on currents $I_1$ and $I_2$.

The reason why the parallelly connected first and second switches 6a and 6b are provided in the feedback wiring 89, and the reason why both the first and second switches 6a and 6b are turned on are as follows.

Specifically, if a plurality of the power converters 1A are prepared, their magnitude relationships between the first and second threshold voltages $V_{th1}$ and $V_{th2}$ of the first and second switching elements $2_A$ and $2_B$ may vary from one another. This may result in the first direction of the feedback current $I_{fb}$ changing from the first switching element $2_A$ to the second switching element $2_B$ or the second direction opposite to the first direction depending on the magnitude relationships between the first and second threshold voltages $V_{th1}$ and $V_{th2}$ of the first and second switching elements $2_A$ and $2_B$.

From this viewpoint, the power converter 1G of the eighth embodiment is configured such that the parallelly connected first and second switches 6a and 6b are provided in the feedback wiring 89, and both the first and second switches 6a and 6b are turned on for increasing the level of the output current of the power converter 1G. Both the on state of the first switch 6a and the on state of the second switch 6b enable the feedback current $I_{fb}$, which has any of the first direction and the second direction, to flow through any of the first switch 6a and the second switch 6b.

Figure 19:
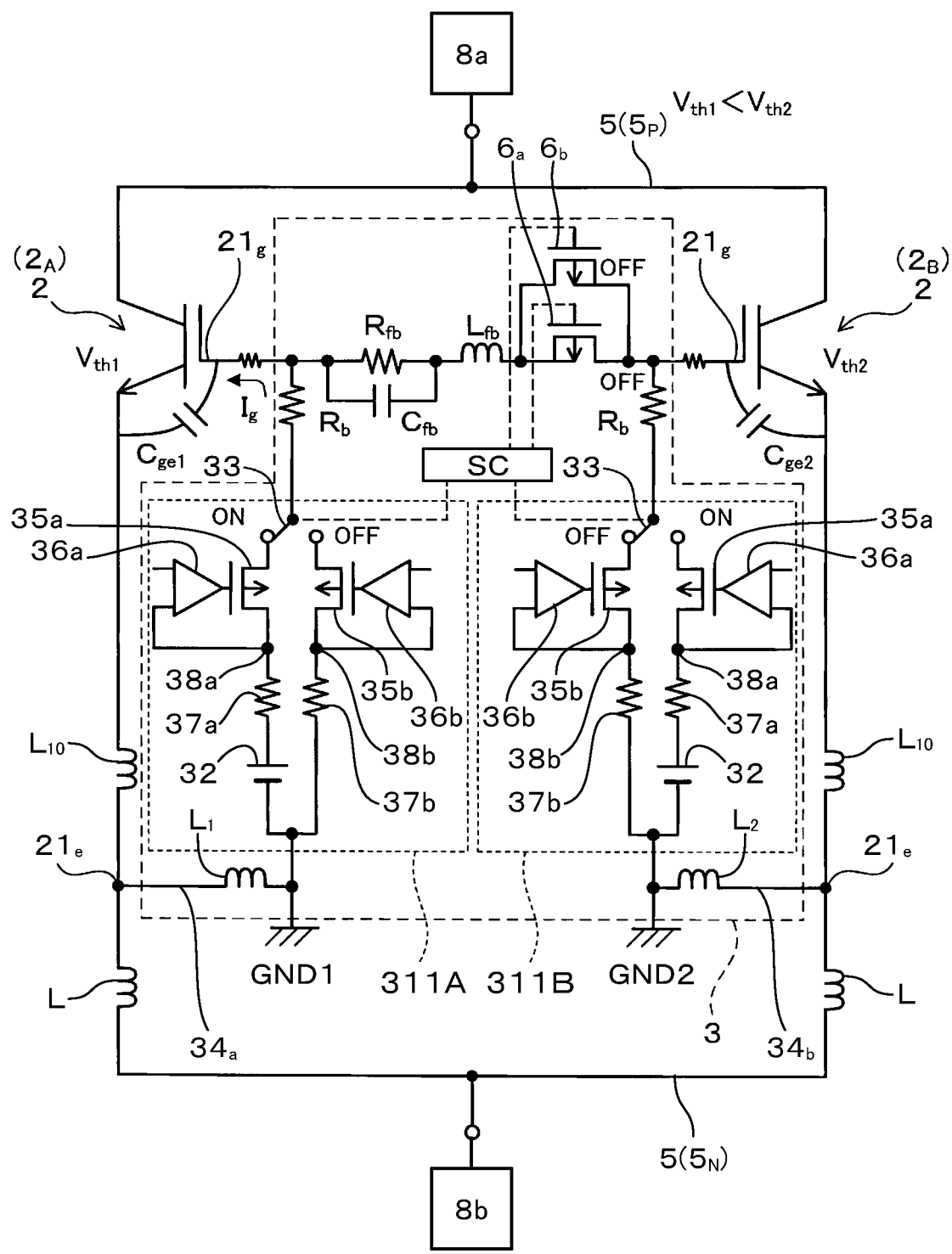

Referring to FIG. 19, for decreasing the level of the total output current of the power converter 1G, the switch controller SC causes (1) The selection switch 33 of the first drive unit 311A to select the first contact ON and the selection switch 33 of the second drive unit 311B to select the second contact OFF, thus turning on the first switching element $2_A$ while keeping the second switching element $2_B$ off (2) Each of the first and second switches 6a and 6b to be turned off This prevents a part of the control current $I_{g1}$ from flowing through the feedback resistor $R_{fb}$, the feedback coil $L_{fb}$, and the shunt resistor 37b of the second drive unit 311B.

That is, if no first and second switches 6a and 6b were provided in the feedback wiring 89, a part of the control current $I_{g1}$ would pass through the feedback resistor $R_{fb}$, the feedback coil $L_{fb}$, and the shunt resistor 37b of the second drive unit 311B so as to flow into the second common signal ground GND2.

However, as described above, turning off both the first and second switches 6a and 6b when turning on only the first switching element $2_A$ inhibits a part of the control current $I_{g1}$ from flowing through the feedback resistor $R_{fb}$, the feedback coil $L_{fb}$, and the shunt resistor 37b of the second drive unit 311B into the second common signal ground GND2. This results in a sufficient level of the first control current $I_{g1}$ flowing to the first switching element $2_A$.

Additionally, the power converter 1G also obtains the same technical benefits as those obtained by the power converter 1 of the first embodiment.

Note that the power converter 1G uses the first and second switches 6a and 6b whose conduction directions are opposite to each other, but the present disclosure is not limited thereto. Specifically, the power converter 1G can use a bidirectional switch in place of the set of the first and second switches 6a and 6b.

Ninth Embodiment

Figure 20:
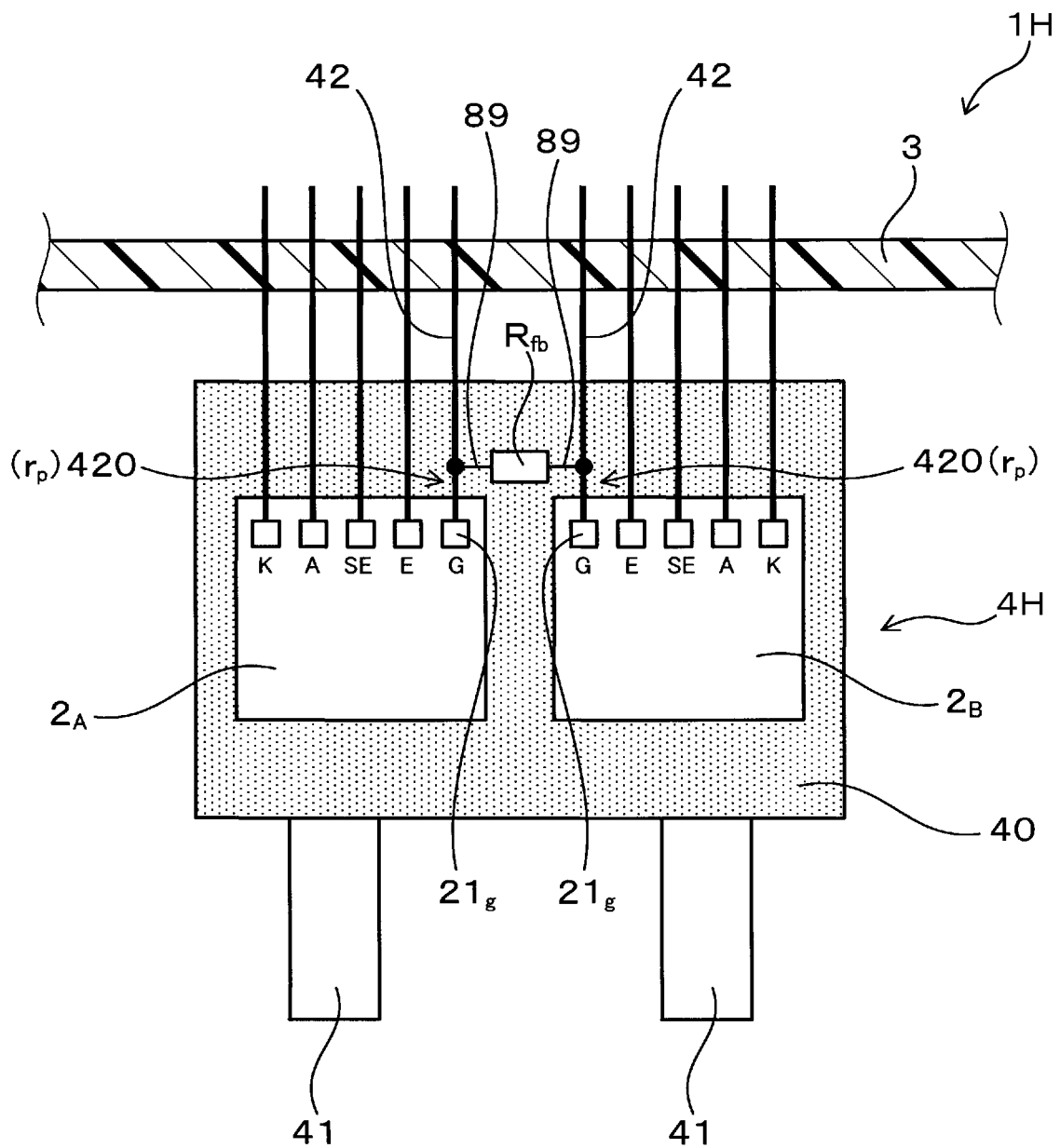
FIG. 20 is an enlarged cross-sectional view of a switch module of a power converter according to the ninth embodiment of the present disclosure.

The following describes the ninth embodiment of the present disclosure with reference to FIG. 20. FIG. 20 schematically illustrates an example of the connection configuration between a switch module 4H and the control circuit 3 of a power converter 1H according to the ninth embodiment.

The structures and/or functions of the power converter 1H according to the ninth embodiment are different from those of the power converter 1 according to the first embodiment in the following points. So, the following mainly describes the different points, and omits or simplifies descriptions of like parts between the first and ninth embodiments, to which identical or like reference characters are assigned, thus eliminating redundant description.

Specifically, each switch unit 4H includes a switch component 40 that packages therein (1) The parallelly connected first and second switching elements $2_A$ and $2_B$ (2) The feedback wiring 89 having the first part connected to the control electrode $21_g$ of the first switching element $2_A$, and the second part connected to the control electrode $21_g$ of the second switching element $2_B$ (3) The feedback resistor $R_{fb}$ provided in the feedback wiring 89

The control circuit 3 includes the five control terminals 42 for each switching element 2 ($2_A$, $2_B$) packaged in the switch component 40 of each switch unit 4H, and the five control terminals 42 are respectively connected to (1) The control terminal (gate electrode) $21_g$ (see reference character G) of the corresponding switching element 2

(2) The reference electrode (emitter electrode) $21_e$ (see reference character E) of the corresponding switching element 2

(3) The sense electrode $21_s$ (see reference character SE) of the corresponding switching element 2

(4) The anode electrode $21_a$ (see reference character A) of the corresponding switching element 2

(5) The cathode electrode $21_k$ (see reference character K) of the corresponding switching element 2

That is, the power converter 1H is configured such that each inter-electrode resistance $r_p$ exists in a portion 420 defined between the corresponding one of the first and second parts of the feedback wiring 89 and the control terminal $21_g$ of the corresponding one of the first and second switching elements $2_A$ and $2_B$.

That is, because the distance between the feedback resistor $R_{fb}$ and the control terminal $21_g$ of the corresponding one of the first and second switching elements $2_A$ and $2_B$ of the power converter 1H is shorter than that in the power converter 1, this configuration of the power converter 1H results in a value of each inter-electrode resistance $r_p$ being smaller. This makes it possible to cause a larger level of the feedback current $I_{fb}$ to flow between the control terminals $21_g$ of the respective first and second switching elements $2_A$ and $2_B$. This enables the imbalance between currents, which flow through the respective first and second switching elements $2_A$ and $2_B$, to be reduced.

Additionally, the power converter 1H also obtains the same technical benefits as those obtained by the power converter 1 of the first embodiment.

Tenth Embodiment

The following describes the tenth embodiment of the present disclosure with reference to FIG. 21. FIG. 21 schematically illustrates selected components of a power converter 1I according to the tenth embodiment; the selected components illustrated in FIG. 21 substantially correspond to the respective selected components illustrated in, for example, FIG. 1.

The structures and/or functions of the power converter 1I according to the tenth embodiment are different from those of the power converter 1 according to the first embodiment in the following points. So, the following mainly describes the different points, and omits or simplifies descriptions of like parts between the first and tenth embodiments, to which identical or like reference characters are assigned, thus eliminating redundant description.

The circuit structure of a control circuit 3I of the power converter 1I is slightly different from the circuit structure of the control circuit 3.

Specifically, the control circuit 3I includes the feedback wiring 89 in which no feedback resistor $R_{fb}$ is provided, and the feedback wiring 89 connects between the control terminals $21_g$ of the respective first and second switching elements $2_A$ and $2_B$. A value of the resistance of the feedback wiring 89 is set to be smaller than the value RA of the on-resistance $R_{on}$, which is the speed adjustment resistance $R_g$, of the drive switch 35a when the gate voltage $V_{ge}$ of each switching element $2_A$, $2_B$ has been held to the Miller voltage $V_M$ within the Miller period $T_M$.

This configuration of the power converter 1I makes it possible to reduce the number of components of the power converter 1I, because no feedback resistor $R_{fb}$ is provided in the feedback wiring 89, resulting in a lower manufacturing cost of the power converter 1I.

Additionally, the power converter 1I also obtains the same technical benefits as those obtained by the power converter 1 of the first embodiment.

Eleventh Embodiment

Figure 22:
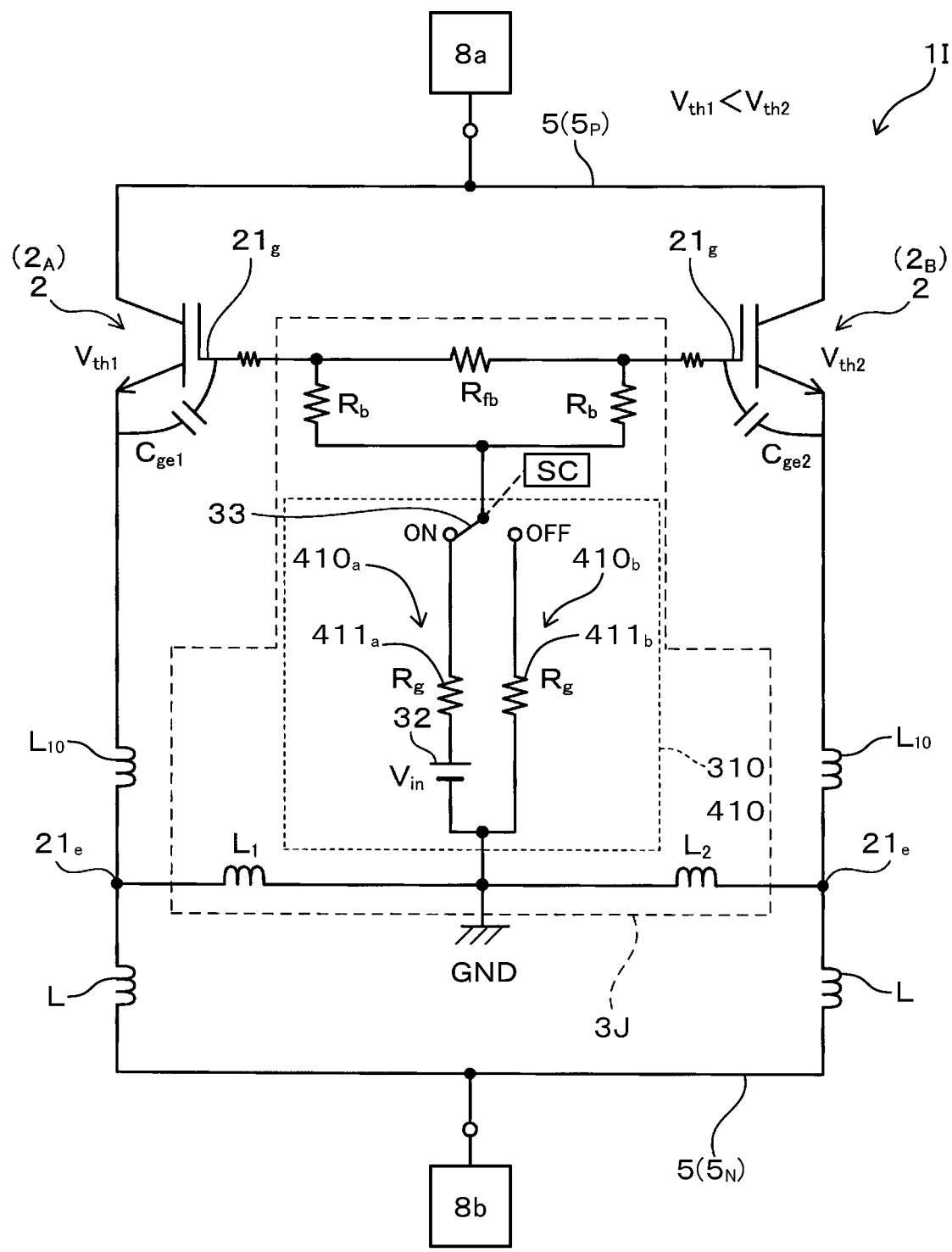
FIG. 22 is a circuit diagram schematically illustrating selected components of a power converter according to the eleventh embodiment of the present disclosure.

The following describes the eleventh embodiment of the present disclosure with reference to FIG. 22. FIG. 22 schematically illustrates selected components of a power converter 1J according to the eleventh embodiment; the selected components illustrated in FIG. 22 substantially correspond to the respective selected components illustrated in, for example, FIG. 1.

The structures and/or functions of the power converter 1J according to the eleventh embodiment are different from those of the power converter 1 according to the first embodiment in the following points. So, the following mainly describes the different points, and omits or simplifies descriptions of like parts between the first and eleventh embodiments, to which identical or like reference characters are assigned, thus eliminating redundant description.

The circuit structure of a control circuit 3J of the power converter 1J is slightly different from the circuit structure of the control circuit 3.

Specifically, the control circuit 3J includes a constant voltage circuit 310 for applying the constant voltage $Vi_n$ to the control electrode $21_g$ of each of the first and second switching elements $2_A$ and $2_B$.

Specifically, the constant voltage circuit 410 includes a first driver 410a, a second driver 410b, and the selection switch 33. The first driver 410a includes a first speed adjustment resistor 411a having the speed adjustment resistance $R_g$, and the DC power source 32. The second driver 410b includes a second speed adjustment resistor 411b having the speed adjustment resistance $R_g$. The first speed adjustment resistor 411a has opposing first and second ends, the first end is connected to the first contact ON, and the second end is connected to the positive terminal of the DC power source 32. The second speed adjustment resistor 411b has opposing first and second ends, the first end is connected to the second contact OFF, and the second end is connected to the common signal ground GND.

As illustrated in FIG. 22, when the switch controller SC instructs the selection switch 33 to select the first contact ON, a constant voltage based on the terminal voltage $Vi_n$ of the drive power source 32 is applied to the control electrode $21_g$ of each of the first and second switching elements $2_A$ and $2_B$.

In contrast, when the switch controller SC instructs the selection switch 33 to select the second contact OFF while each switching element $2_A$, $2_B$ is in the on state, a discharge current starts to be discharged from the corresponding one of the first and second capacitances $C_{ge1}$ and $C_{ge2}$, and the discharge current flows to the common signal ground GND via the second driver 310b.

The speed adjustment resistance $R_g$ of each of the first and second speed adjustment resistors 411a and 411b is maintained at a predetermined constant value while each switching element $2_A$, $2_B$ is within the Miller period $T_M$ or within the other period.

Additionally, the power converter 1J also obtains the same technical benefits as those obtained by the power converter 1 of the first embodiment.

Twelfth Embodiment

Figure 23:
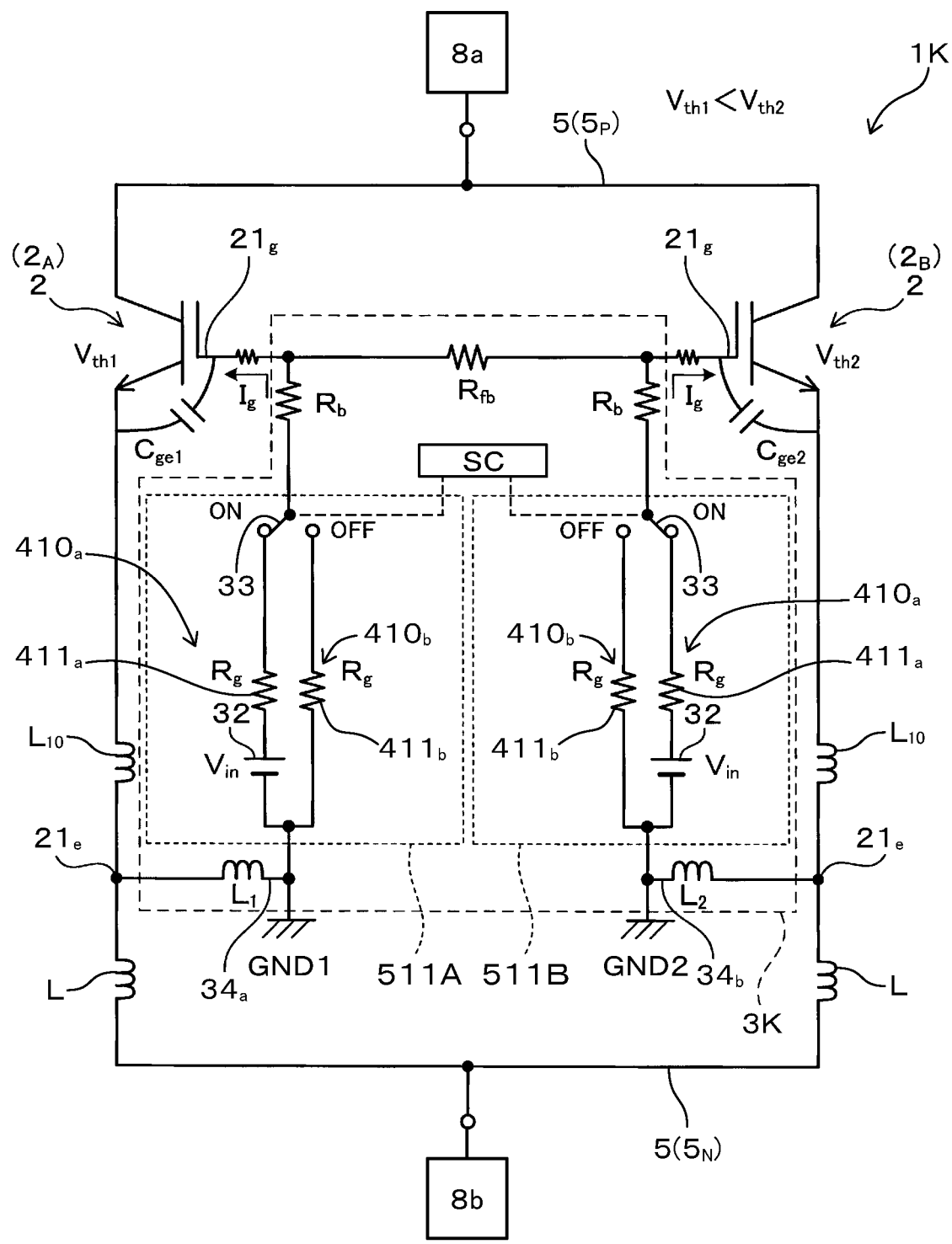
FIG. 23 is a circuit diagram schematically illustrating selected components of a power converter according to the twelfth embodiment of the present disclosure.

The following describes the twelfth embodiment of the present disclosure with reference to FIG. 23. FIG. 23 schematically illustrates selected components of a power converter 1K according to the twelfth embodiment; the selected components illustrated in FIG. 23 substantially correspond to the respective selected components illustrated in, for example, FIG. 22.

The structures and/or functions of the power converter 1K according to the twelfth embodiment are different from those of the power converter 1 according to the eleventh embodiment in the following points. So, the following mainly describes the different points, and omits or simplifies descriptions of like parts between the eleventh and twelfth embodiments, to which identical or like reference characters are assigned, thus eliminating redundant description.

The circuit structure of a control circuit 3K of the power converter 1K is slightly different from the circuit structure of the control circuit 3J.

Specifically, the control circuit 3K includes a plurality of, i.e. twelve, drive units 511 provided for the respective switching elements 2, and the switch controller SC controllably connected to the respective drive units 511.

The drive units 511 include first drive units 511A provided for respectively driving the first switching elements $2_A$, and second drive units 511B provided for respectively driving the second switching elements $2_B$.

Specifically, each of the first and second drive units 511A and 511B is comprised of the first driver 410a, the second driver 410b, and the selection switch 33, which is similar to the drive unit 410 of the eleventh embodiment. Like the drive unit 410, the first driver 410a includes the first speed adjustment resistor 411a having the speed adjustment resistance $R_g$, and the DC power source 32. The second driver 410b includes the second speed adjustment resistor 411b having the speed adjustment resistance $R_g$.

That is, the first drive unit 511A can be configured to turn on or off the first switching element $2_A$ independently of the second switching element $2_B$, and the second drive unit 511B can be configured to turn on or off the second switching element $2_B$ independently of the first switching element $2_A$.

This configuration enables the switching controller SC to instruct both the first and second drive units 511A and 511B to cause the respective first and second switching elements 2 ($2_A$, $2_B$) to output the respective on currents $I_1$ and $I_2$ for responding to a request to obtain a large level of the total output current of the power converter 1K. In contrast, this configuration enables the switching controller SC to instruct one of the first and second drive units 511A and 511B to cause a corresponding one of the first and second switching elements 2 ($2_A$, $2_B$) to output a corresponding one of the on currents $I_1$ and $I_2$ if there is no request to obtain a large level of the total output current of the power converter 1K.

Additionally, the negative terminal of the drive power source 32 and the second end of the second speed adjustment resistor 411b of the first drive unit 511A are connected to the first common signal ground GND1 of the control circuit 3K via the first wiring 34a. The first reference line $21_eL1$ connecting between the reference electrode $21_e$ of the first switching element $2_A$ and the negative busbar $5_N$ is connected to the first common signal ground GND1.

Similarly, the negative terminal of the drive power source 32 and the second end of the second speed adjustment resistor 411b of the second drive unit 511B are connected to the predetermined second common signal ground GND2 of the control circuit 3K via the second wiring 34b. The second reference line $21_eL2$ connecting between the reference electrode $21_e$ of the second switching element $2_B$ and the negative busbar $5_N$ is connected to the second common signal ground GND2.

The power converter 1K obtains the same technical benefits as those obtained by the power converter 1A of the second embodiment in addition to the technical benefits obtained by the power converter 1J.

Thirteenth Embodiment

Figure 24:
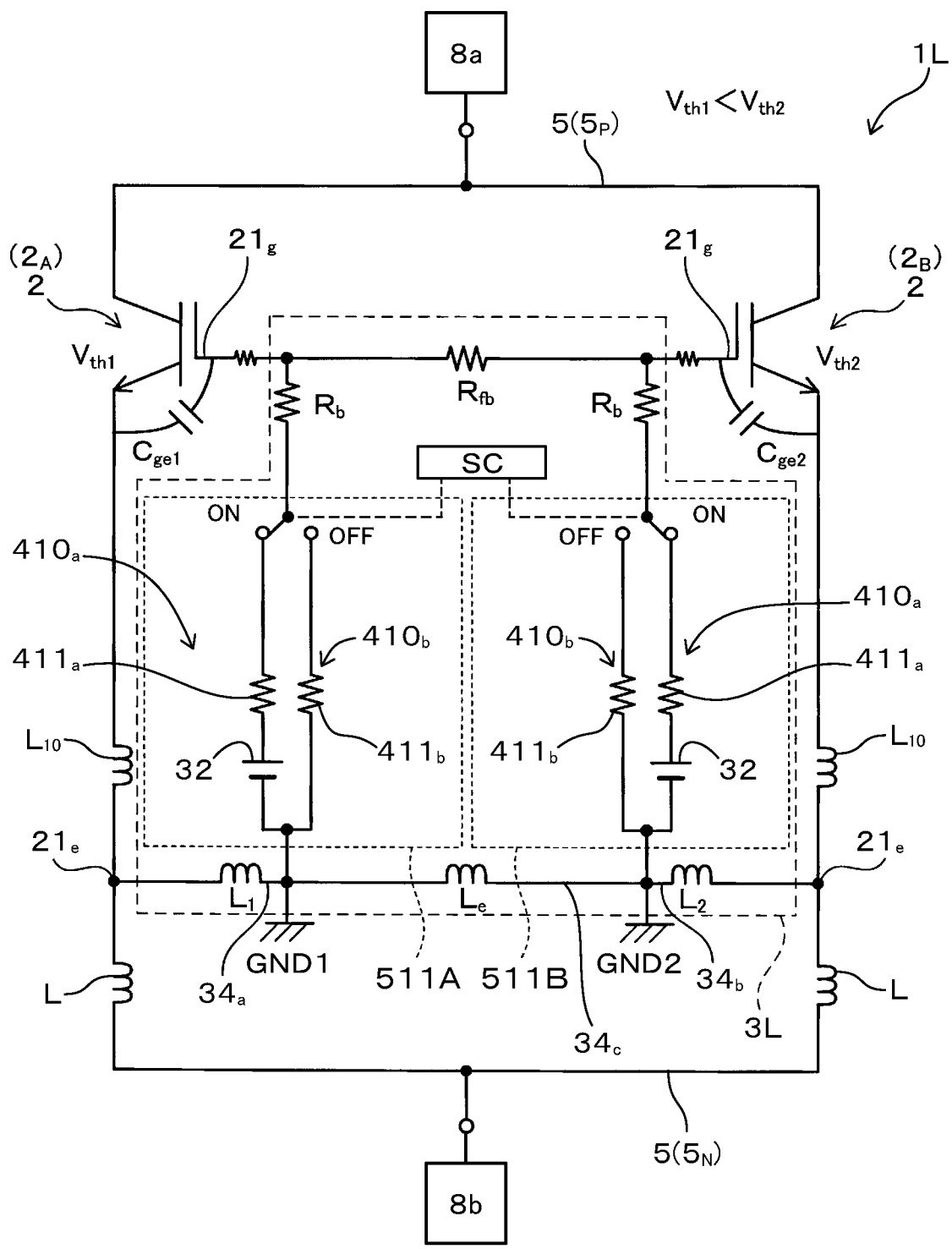
FIG. 24 is a circuit diagram schematically illustrating selected components of a power converter according to the thirteenth embodiment of the present disclosure.

The following describes the thirteenth embodiment of the present disclosure with reference to FIG. 24. FIG. 24 schematically illustrates selected components of a power converter 1L according to the thirteenth embodiment; the selected components illustrated in FIG. 24 substantially correspond to the respective selected components illustrated in, for example, FIG. 23.

The structures and/or functions of the power converter 1L according to the thirteenth embodiment are different from those of the power converter 1K according to the twelfth embodiment in the following points. So, the following mainly describes the different points, and omits or simplifies descriptions of like parts between the twelfth and thirteenth embodiments, to which identical or like reference characters are assigned, thus eliminating redundant description.

The circuit structure of a control circuit 3L of the power converter 1L is slightly different from the circuit structure of the control circuit 3K.

Specifically, the control circuit 3L includes the intermediate wiring 34c connecting between the first wiring 34a and the second wiring 34b, and the reference coil $L_e$ mounted to the intermediate wiring 34c. That is, the reference coil $L_e$ is arranged between the reference electrodes $21_e$ of the first and second switching elements $2_A$ and $2_B$.

The power converter 1L obtains the same technical benefits as those obtained by the power converter 1B of the third embodiment in addition to the technical benefits obtained by the power converter 1K.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A power converter comprising:
   a first switching element;
   a second switching element connected in parallel to the first switching element; and
   a control circuit configured to perform on-off switching operations of each of the first and second switching elements to thereby convert input power to output power,
   wherein:
   each of the first and second switching elements has:
      a control electrode connected to the control circuit, and
      a reference electrode serving as a reference potential for a potential of the control electrode;
   the control circuit comprises at least one drive unit configured to apply a control current to the control electrode of each of the first and second switching elements based on a control voltage to thereby turn on a corresponding one of the first and second switching elements, so that an on current flows through the reference electrode of the corresponding one of the first and second switching elements;
   the control circuit has a speed adjustment resistor configured to limit the control current to adjust a switching speed of each of the first and second switching elements;
   the speed adjustment resistor has a resistance that varies depending on a voltage at the control electrode of each of the first and second switching elements;

the power converter further comprises:
   a feedback route connecting between the control electrode of the first switching element and the control electrode of the second switching; and
   the feedback route has a resistance that is set to be lower than a value of the resistance of the speed adjustment resistor during a predetermined Miller period of each of the first and second switching elements.

2. The power converter according to claim 1, wherein:
the feedback route is configured to cause a feedback current to flow from the control electrode of one of the first and second switching elements to the control electrode of the other of the first and second switching elements when the voltage at the control electrode of the one of the first and second switching elements is higher than the voltage at the control electrode of the other of the first and second switching elements.

3. The power converter according to claim 1, wherein:
the feedback route comprises a feedback resistor having the resistance that is set to be lower than the value of the resistance of the speed adjustment resistor during a predetermined Miller period of each of the first and second switching elements.

4. The power converter according to claim 3, wherein:
the feedback route comprises a capacitor connected in parallel to the feedback resistor.

5. The power converter according to claim 3, wherein:
the feedback route comprises a coil connected in series to the feedback resistor.

6. The power converter according to claim 3, wherein:
the control circuit incorporates therein the feedback resistor.

7. The power converter according to claim 3, further comprising:
a switch module configured to incorporate therein the first and second switching elements and the feedback resistor.

8. The power converter according to claim 3, wherein the feedback route comprises at least one switch located between the feedback resistor and the control electrode of one of the first and second switching elements.

9. The power converter according to claim 8, wherein:
the at least one switch comprises a pair of a first switch and a second switch, each of the first and second switches having a predetermined conduction direction, the predetermined conduction directions of the first and second switches being opposite to each other,
the first and second switches being connected to be in parallel to each other, and
the first and second switches being located between the feedback resistor and the control electrode of one of the first and second switching elements.

10. The power converter according to claim 8, wherein:
the reference electrodes of the first and second switching elements are respectively connected to first and second grounds that are electrically isolated from each other.

11. The power converter according to claim 8, further comprising:
a reference coil connecting between the reference electrode of the first switching element and the reference electrode of the second switching element.

12. The power converter according to claim 1, wherein:
the at least one drive unit comprises a single drive unit configured to apply the control current to the control electrode of each of the first and second switching elements to thereby turn on the corresponding one of the first and second switching elements.

13. The power converter according to claim 1, wherein:
the at least one drive unit comprises at least first and second drive units provided for the first and second switching elements, respectively, each of the first and second drive units being configured to apply the control current to the control electrode of the corresponding one of the first and second switching elements to thereby turn on the corresponding one of the first and second switching elements.

* * * * *